(12) United States Patent
Inada et al.

(10) Patent No.: US 7,375,330 B2
(45) Date of Patent: May 20, 2008

(54) CHARGED PARTICLE BEAM EQUIPMENT

(75) Inventors: Hiromi Inada, Hitachinaka (JP);
Hiroyuki Tanaka, Hitachinaka (JP);
Shun-ichi Watanabe, Hitachinaka (JP);
Shigeto Isakozawa, Hitachinaka (JP);
Mitsugu Sato, Hitachinaka (JP);
Atsushi Takane, Mito (JP); Satoshi Yamaguchi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 234 days.

(21) Appl. No.: 11/396,654

(22) Filed: Apr. 4, 2006

(65) Prior Publication Data

US 2006/0219908 A1   Oct. 5, 2006

(30) Foreign Application Priority Data

Apr. 5, 2005   (JP)   .............................. 2005-108765

(51) Int. Cl.
*G01N 23/00*   (2006.01)
(52) U.S. Cl. ...................... 250/310; 250/306; 250/307; 250/309; 250/311; 702/85
(58) Field of Classification Search ................ 250/310, 250/306, 307, 309, 311; 702/85
See application file for complete search history.

(56) References Cited

U.S. PATENT DOCUMENTS

| 6,596,993 | B1* | 7/2003 | Sicignano et al. | .......... 250/311 |
| 2003/0039386 | A1 | 2/2003 | Ishitani et al. | |
| 2005/0189501 | A1* | 9/2005 | Sato et al. | ............. 250/492.22 |
| 2006/0151697 | A1* | 7/2006 | Inada et al. | ................. 250/310 |

FOREIGN PATENT DOCUMENTS

JP   2002-15691 A   1/2002

* cited by examiner

*Primary Examiner*—Robert Kim
*Assistant Examiner*—Michael Maskell
(74) *Attorney, Agent, or Firm*—McDermott Will & Emery LLP

(57) ABSTRACT

Charged particle beam equipment has a processing unit for calibrating dimension values of an enlarged specimen image, and means for changing the amount by which a charged particle beam is scanned. Also, a specimen stand has a mechanism for holding a specimen having a periodical structure or a specimen simultaneously having a periodical structure and a non-periodica structure, and a storage device for automatically changing a magnification for an enlarged specimen image, and storing measured values at all magnifications.

13 Claims, 20 Drawing Sheets

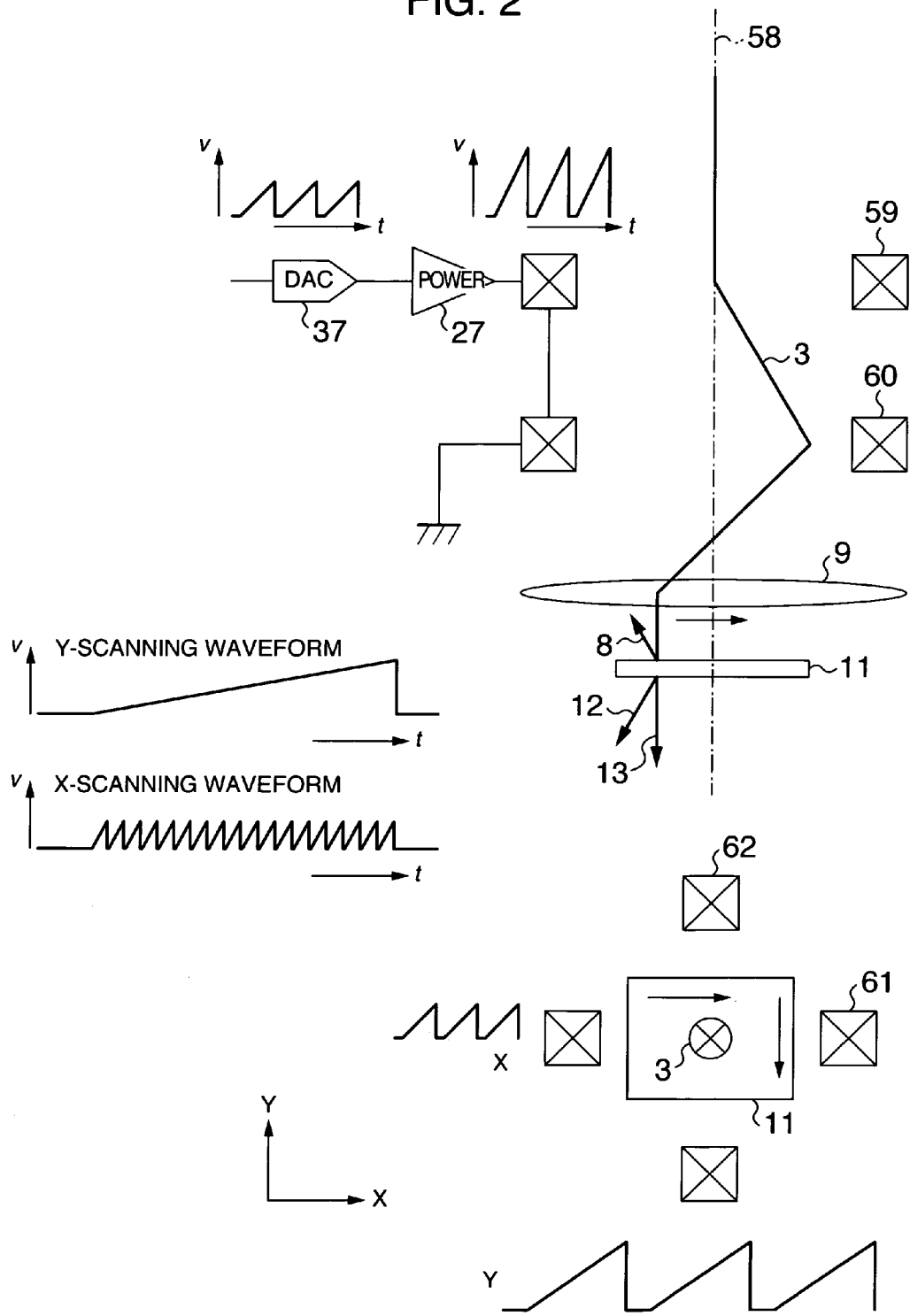

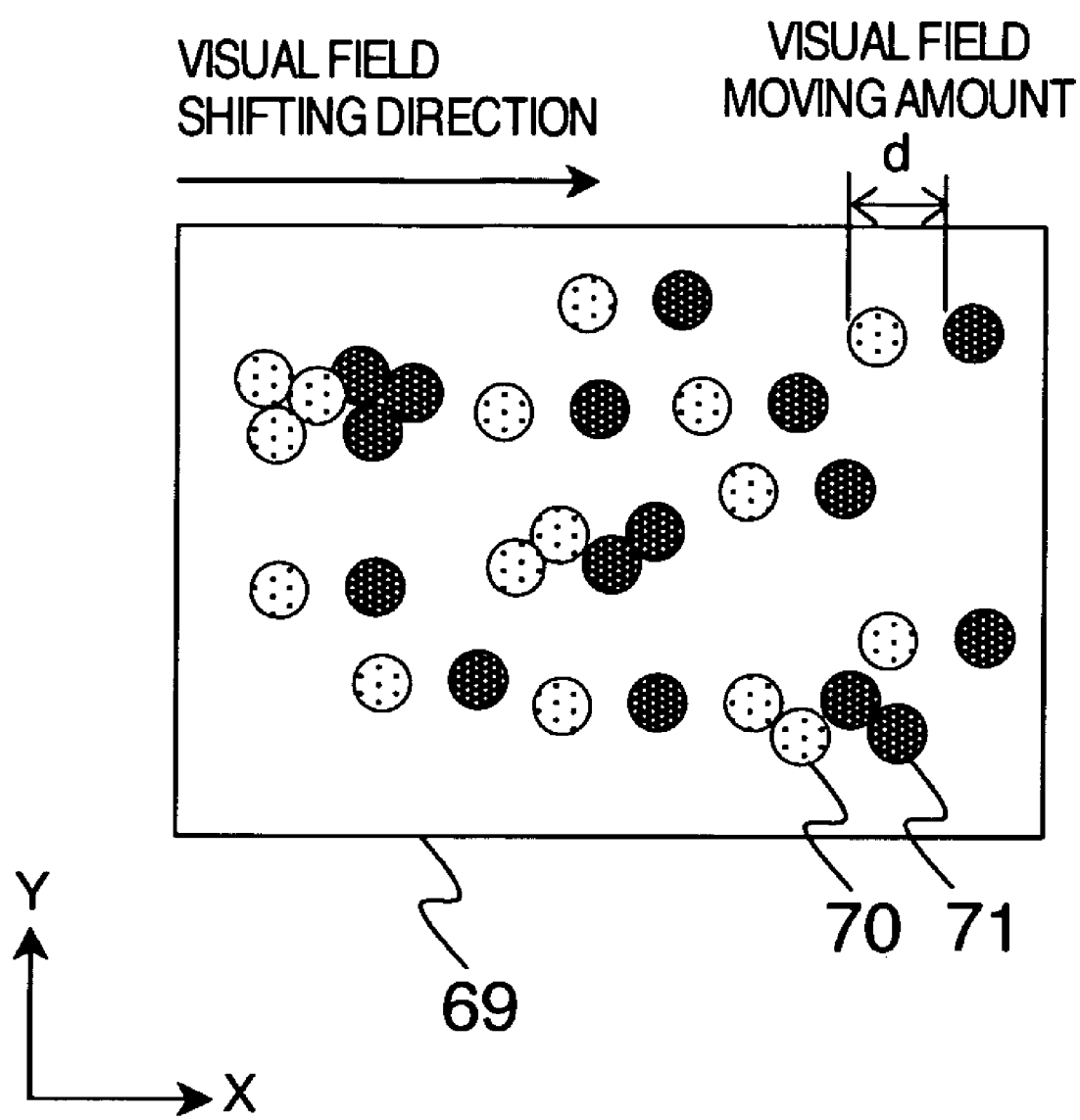

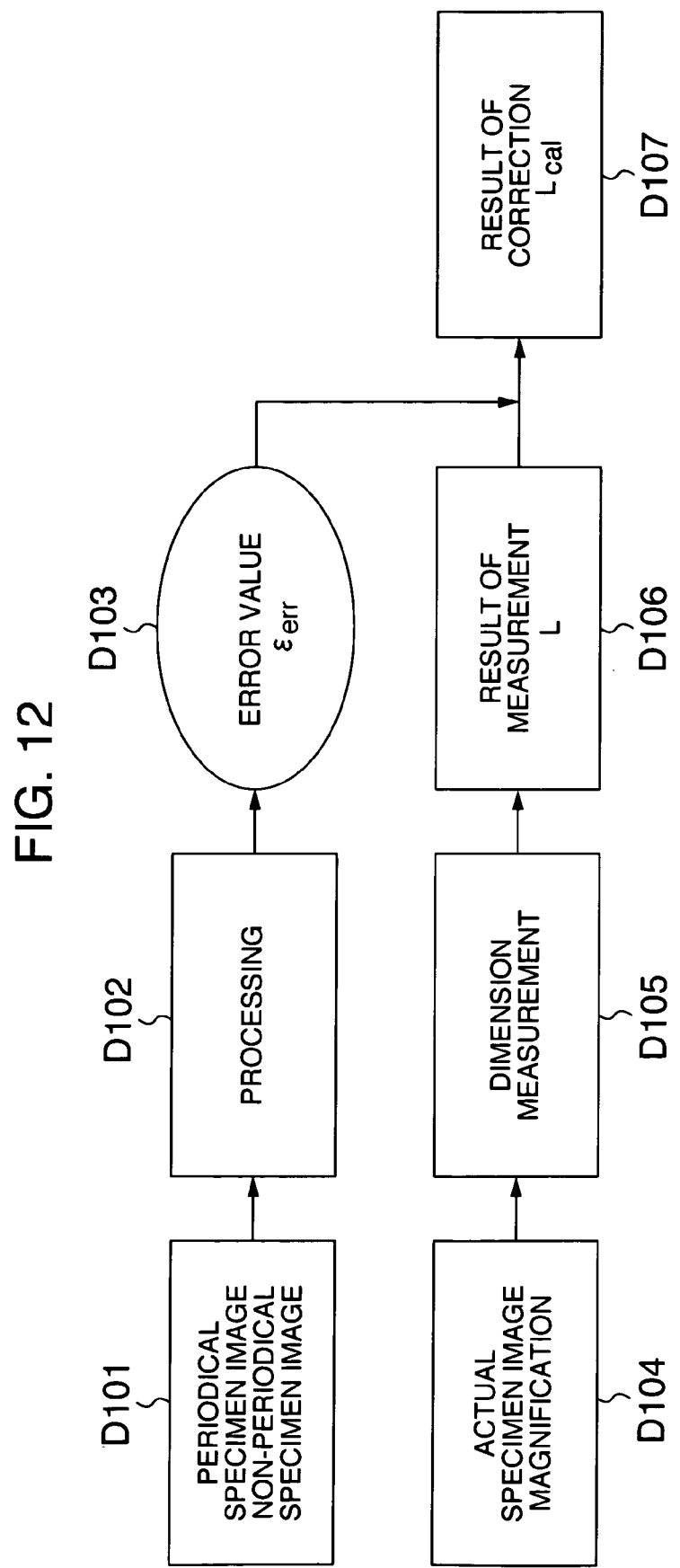

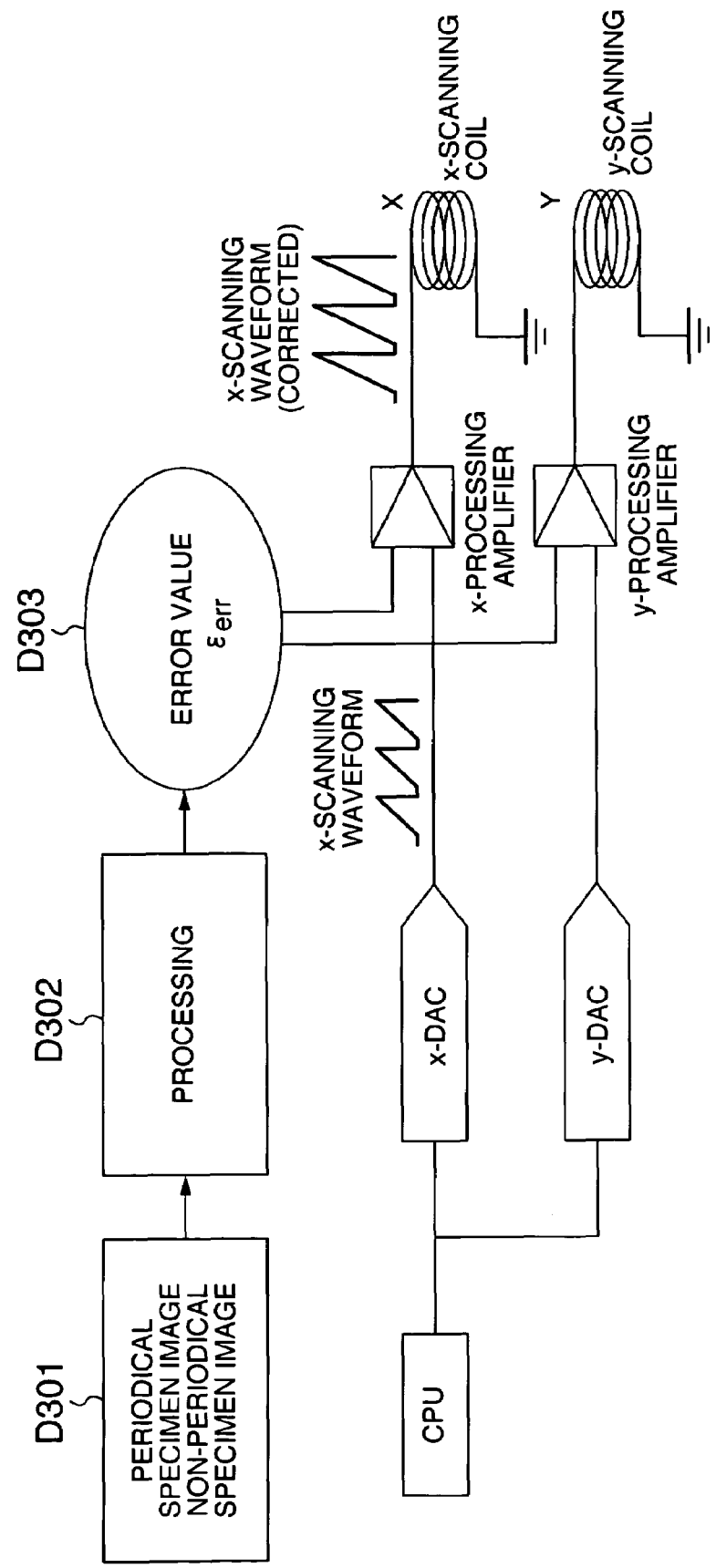

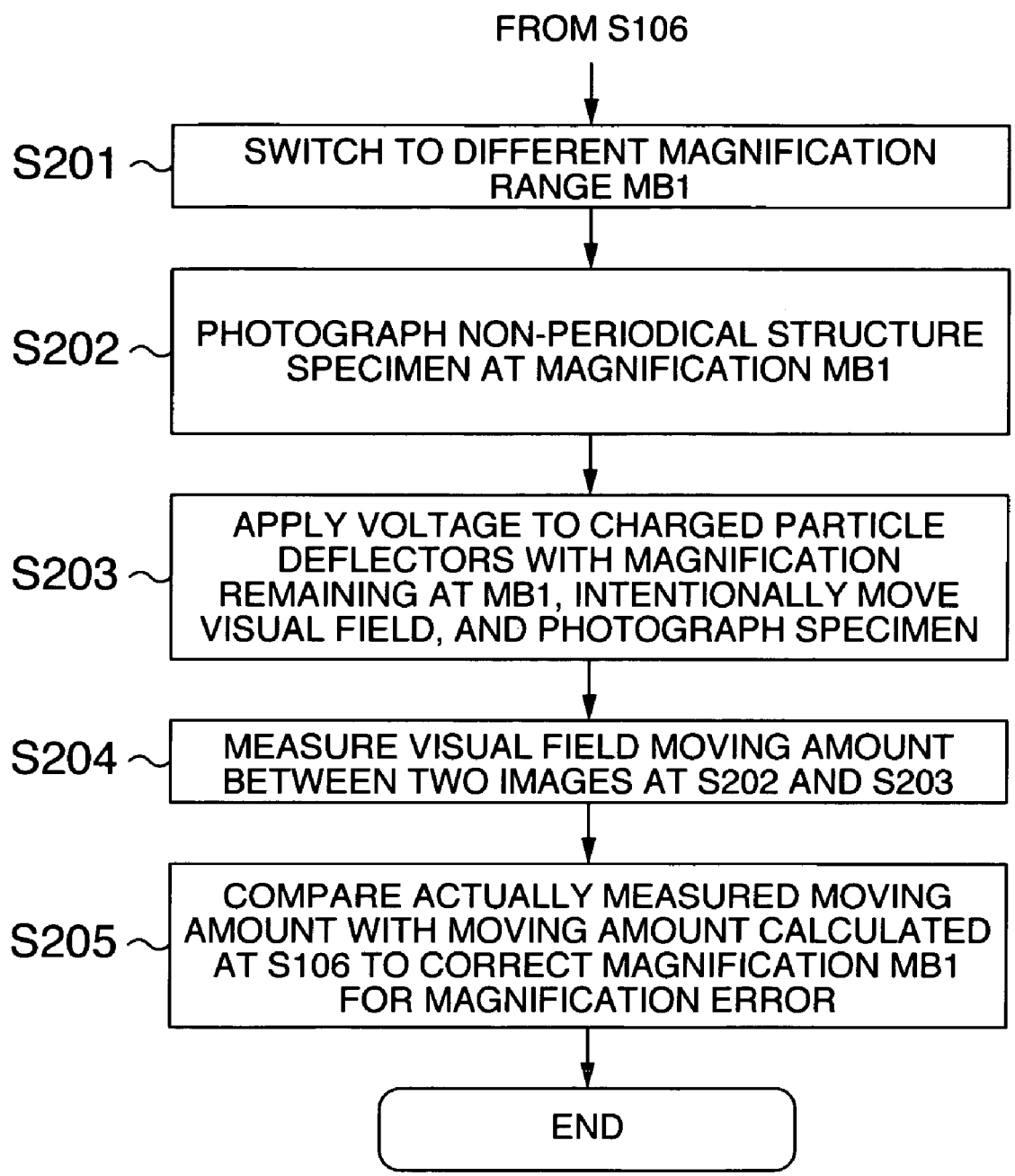

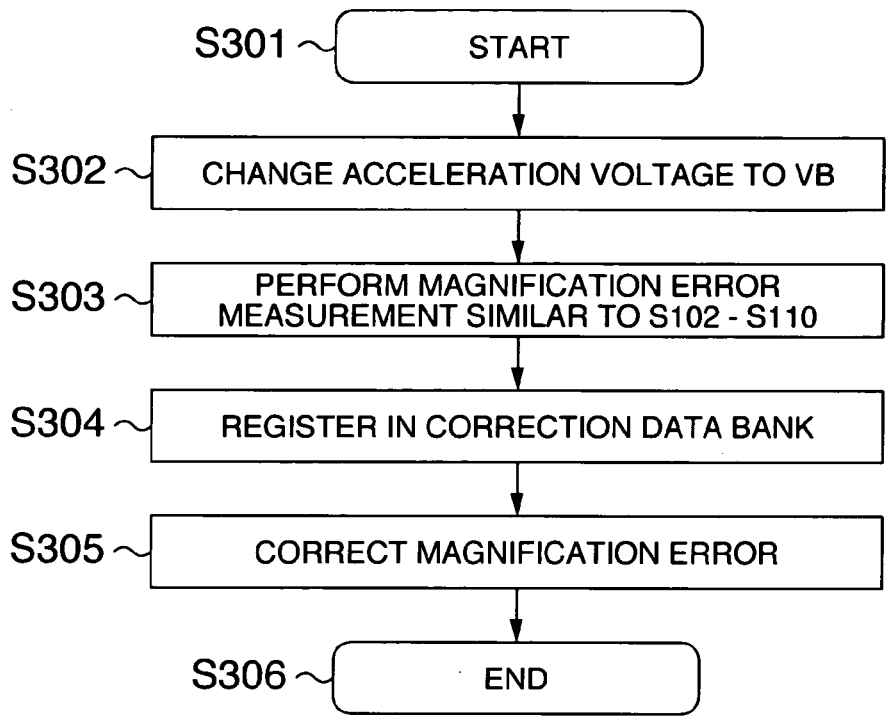
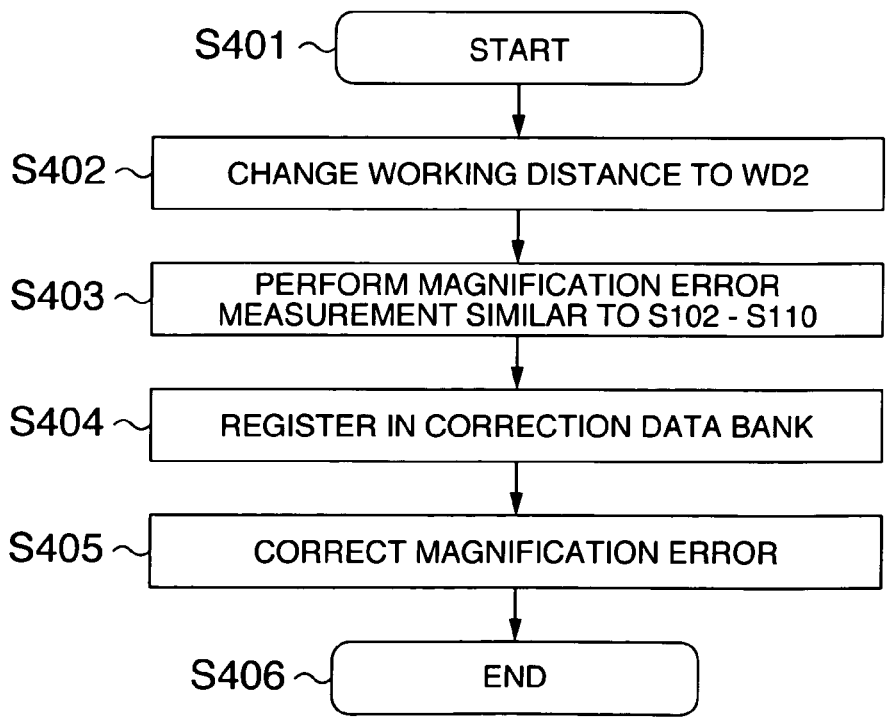

IMAGE ROTATION ANGLE 0

IMAGE ROTATION ANGLE $\theta$

SCHEMATIC DIAGRAM OF ORIGINAL STRUCTURE

EXAMPLE OF BODY DISPLAY UNIT
(SECONDARY ELECTRON IMAGE AND SCANNING
TRANSMITTED ELECTRON IMAGE)

CHARGED PARTICLE BEAM EQUIPMENT

BACKGROUND OF THE INVENTION

The present invention relates to charged particle beam equipment which scans a charged particle beam on a specimen to form an image using a signal generated from the specimen by the irradiated charged particle beam.

Examples of apparatus for observing an enlarged image of a specimen using a charged particle beam include a scanning electron microscope, a scanning transmission electron microscope, and a focused ion beam observation processing apparatus. An observation magnification in the charged particle beam equipment is defined by a ratio of the amount of charged particle beam scanned on a specimen surface to an enlarged image generated from detected secondary electrons and the like from a scanned area.

The amount of charged particle beam scanned on a specimen can be arbitrarily varied in accordance with the intensity of an electric field or a magnetic field which is acted on the charged electron beam by a scanning mechanism. For example, for a scanning electron microscope which employs electrons for charged particles and a magnetic field for an electromagnetic lens and electron scanning mechanism, the magnification of a secondary electron beam can be changed by changing the magnitude of a current applied to electron beam scanning coils, and changing an area on a specimen which is scanned by an electron beam.

A narrower area scanned by an electron beam on a specimen results in a larger magnification of a secondary electron image, while a wider scanning area results in a smaller magnification.

FIG. 2 is a diagram illustrating the principles of a mechanism for scanning a charged particle beam. Assume herein that charged particles are electrons. An electron beam 3 moves along an electron beam optical axis 58. Scanning coils 61, 62 are symmetrically disposed on the electron beam optical axis in the X- and Y-directions. The scanning coils are disposed at an upper and a lower stage for applying the electron beam perpendicularly to a specimen. Saw wave scanning signals are applied to the upper scanning coil 59 and lower scanning coil 60, respectively, to cause the electron beam to reach a prefocal position of an objective electromagnetic lens 9 on the optical axis, thereby allowing the electron beam to impinge perpendicularly to the specimen.

The incident electron beam interacts with the specimen to generate secondary electrons 8, specimen forward scattering electrons 12, specimen transmitted electrons 13. Detected signals of these secondary electrons 8, specimen forward scattering electrons 12, and specimen transmitted electrons 13 are synchronized with scanning waveforms to from an enlarged image of the specimen. The magnification of the enlarged image of the specimen depends on the voltages of the scanning waveforms applied to the X- and Y-scanning coils.

FIG. 3B is a graph showing a magnification M at which a specimen is enlarged and a maximum value $V_{max}$ of a scanning waveform voltage applied to a scanning coil, where the maximum value $V_{max}$ of the scanning waveform voltage has an inversely proportional relationship to the specimen magnification M. While an infinite number of magnifications can be ensured in principle by continuously varying the scanning wave voltage using a variable resistor or the like, the continuously variable magnification is inconvenient and unnecessary in practical use. However, since the observation magnification of charged particle beam equipment generally ranges from a minimum magnification to a maximum magnification which is $10^3$ times higher than the minimum magnification, a reference scanning wave voltage is applied to the scanning coil through voltage attenuators which are provided on a range-by-range basis, as illustrated in FIG. 3A.

The magnification is switched in steps, for example, 1,000 times, 1,500 times, 2,000 times, 3,000 times, . . . , and magnification ranges are defined for ensuring a wide magnification span, such as in the form of a range 1 from $1\times10^3$ times to $9\times10^3$ times, a range 2 from $10\times10^3$ times to $90\times10^3$ times, a range 3 from $100\times10^3$ times to $900\times10^3$ times, and a range 4 from $1,000\times10^3$ times to $9,000\times10^3$ times.

For measuring a correct scanning amount of charged particle beam in conventional charged particle beam equipment such as a scanning electron microscope and a focused ion beam processing apparatus, i.e., for measuring a correct magnification for an enlarged specimen image, a scanning secondary electron image or a scanning transmitted electron image of a microscale specimen (FIG. 4A) or crystal lattice fringe (FIG. 4B) has been used to measure an interval dimension of which indicates a dimensional feature.

The measured result, i.e., a deviation of an actually measured value from a reference dimension value is given as a magnification deviation, i.e., magnification error.

JP-A-2002-15691 describes a calibration of magnification for a scanning electron microscope using a standard specimen.

SUMMARY OF THE INVENTION

The accuracy of the specimen magnification is determined by the accuracy of scanning waveform voltages applied to the X- and Y-scanning coils. In a system which employs a digital/analog converter (DAC) 37 and a coil power supply 27 to apply scanning voltages to the scanning coils 59, 60, as illustrated in the example of FIG. 2, the accuracy of measurement between magnifications varies depending mainly on errors outputted from the DAC 37, and quantum error of the least significant bit (LSB) of the DAC 37.

On the other hand, as illustrated in FIG. 3A, fixed resistors are used for the attenuators for switching magnification ranges. Magnification errors between the magnification ranges depend on inherent errors such as errors associated with the manufacturing of the fixed resistors. Though depending on particular products, fixed resistors generally have a tolerance of approximately ±0.1% to 10%.

Assuming that a maximum scanning waveform voltage of 10 volts is applied to the scanning coils with a magnification of 1,000 times in the range 1, the attenuator attenuates this voltage to one volt which is applied to the scanning coils with a magnification of 10,000 times in the range 2. When the fixed resistors have an error of +0.1% in the range 1, and −0.1% in the range 2, images are recorded with magnification errors of 1,001 times for 1,000 times and 9,990 times for 10,000 times, respectively.

It is a first object of the present invention to restrain variations in errors between magnification steps in charged particle beam equipment.

Also, a conventional correction for a magnification error using a reference specimen is made and ensured only with a magnification with which the reference specimen was photographed, so that this way of correction experiences difficulties in satisfying the continuity of magnification errors between magnification steps, and continuity of magnification errors between magnification ranges. It is a time-consuming and labor-intensive work to correct for magnifications over all magnification steps using a magnification reference specimen. Since the magnification reference specimen as shown in FIG. 4 has a defined pitch dimension, an interval indicative of a dimensional feature can be observed between particular magnifications, but a resulting image does not have significant information if the magnification is too low, and does not either have significant information if the magnification is in turn too high.

Therefore, no specimen has been generally available for calibration from a low magnification to a high magnification in charged particle beam equipment which has a magnification dynamic range exceeding $10^3$.

It is a second object of the present invention to ensure an accuracy of measurement between magnifications using the same specimen even between different magnification steps.

For correcting charged particle beam equipment for the accuracy of measurement, measured values must be calibrated using a dimensional reference specimen at an arbitrarily extracted magnification or at all magnification steps. For example, for charged particle beam equipment which has two acceleration voltages and two working distances with 50 magnification steps, a total of 200 dimensional calibrations are required, which involves a long time and a high cost.

It is therefore a third object of the present invention to automate a correction for an accuracy of measurement which has conventionally been made through intervention of an operator or an equipment adjusting person.

Further, in conventional charged particle beam equipment, a magnification error occurs due to differences in acceleration voltage and specimen working distance. For example, in charged particle beam equipment which is capable of changing an acceleration voltage, a varying voltage is applied to scanning coils even at the same specimen magnification due to different motion energy of charged particle beams. For this reason, the accuracy of measurement varies when the acceleration voltage is changed. Also, when the working distance is changed, a focal point is changed by changing the excitation intensity of an objective electromagnetic lens, thus resulting in a change in the voltage applied to the scanning coils and an eventual difference in accuracy of measurement.

It is a fourth object of the present invention to provide a function of calibrating and holding an accuracy of measurement in a variety of optical observation conditions such as an acceleration voltage, a specimen working distance (WD) and the like.

For observing an enlarged image of a specimen with charge particle beam equipment, an operator subsequently rotates the image in a desired direction for making an evaluation using the photographed enlarged specimen image. In this event, a requirement of passing the image through an image rotating circuit involves an addition of signals of the image in the X-direction and Y-direction, resulting in a different magnification error as compared with an image not rotated.

It is a fifth object of the present invention to correct a rotated enlarged specimen image, which has been passed through an image rotating circuit, for a magnification error and a dimensional error.

An example of charged particle beam equipment of the present invention is characterized in that a ratio of a control amount of the deflector to a visual field moving amount is calculated at the same accuracy as an accuracy of measurement of the specimen having a known periodical structure, using a magnification error of a first magnification derived by extracting a periodical dimension by the image processing unit from an enlarged image of the specimen having the known periodical structure recorded at the first magnification, and the visual field moving amount, and the visual field moving amount measured by the image processing unit from a reference image and an evaluation image, the reference image being an enlarged image of the specimen having a non-periodical structure recorded at the first magnification, and the evaluation image being an enlarged image of the specimen having a non-periodical structure recorded at the first magnification with a visual field being moved by controlling the deflector.

Other charged particle beam equipment of the present invention is characterized in that a magnification error of a first magnification is derived by extracting a periodical dimension from an enlarged image of the specimen having a known periodical structure recorded at the first magnification by the image processing unit, an enlarged image of the specimen having a non-periodical structure is recorded at the first magnification corrected for the magnification error as a reference image, the enlarged view of the specimen having the non-periodical structure is recorded as an evaluation image after a visual field has been moved by controlling the deflector, a ratio of a control amount of the deflector to a visual field moving amount is found from a visual field moving amount of the evaluation image with respect to the reference image measured by the image processing unit, the magnification is set to a second magnification different from the first magnification, a visual field moving amount of an enlarged view of the non-periodical structure specimen is found before and after the visual field is moved by controlling the deflector, the second magnification is calibrated from a ratio of the visual field moving amount at the second magnification to the visual field moving amount at the first magnification corrected for the magnification error.

The specimen having a known periodical structure may be a single crystal thin film specimen having a known crystal structure, and the detector may be a transmitted electron detector. The specimen having a known periodical structure may be a single crystal thin film specimen having a known crystal structure, and the detector may be a scattered electron detector. Also, the specimen may include a mixture of a non-periodical structure and a known periodical structure. Also, enlarged specimen images may be simultaneously photographed from two different types of charged particle beams generated from the specimen including a mixture of the non-periodical structure and the known periodical structure to simultaneously acquire and process feature amounts of the periodical structure and the non-periodical structure.

The magnification reference specimen may not be a specimen having a periodical structure but may be a specimen having a non-periodical structure, the dimension values of which are known.

The magnification is calibrated by correcting a measured value evaluated with an enlarged specimen image. Also, the photographed enlarged specimen image can be scaled up or down to output an image which has been calibrated for the magnification, or a voltage waveform applied to the scanner can be corrected to calibrate the magnification.

The charged particle beam equipment of the present invention can have a correction data table which records a magnification correction value for each magnification step. The magnification correction data table may record a magnification correction value when an acceleration voltage is changed for a charged particle beam, or a magnification correction value when a working distance is changed.

Further charged particle beam equipment of the present invention is characterized in that a magnification error of a first magnification is derived by extracting a periodical dimension from an enlarged image of the specimen having a known periodical structure recorded at the first magnification by the image processing unit, an enlarged image of a specimen having a non-periodical structure is recorded at the first magnification corrected for the magnification error as a reference image, the enlarged view of the specimen having the non-periodical structure is recorded as an evaluation image after a visual field has been moved by controlling the deflector, a ratio of a control amount of the deflector to a visual field moving amount is found from a visual field moving amount of the evaluation image with respect to the reference image measured by the image processing unit, the specimen image is rotated by the specimen image rotation unit to display a rotated specimen image, a visual field moving amount of an enlarged view of the non-periodical structure specimen is found before and after the visual field is moved by controlling the deflector, and the magnification is calibrated for the specimen image rotated by the specimen image rotation unit from a ratio of a visual field moving amount when the specimen image is rotated to a visual field moving amount of the enlarged specimen image not rotated.

According to the present invention, a magnification accuracy can be accurately calibrated using a specimen, the dimensions of which are known, and the accuracy of which is guaranteed, at a magnification which is not suitable for a magnification at which the specimen is observed. Also, a measured accuracy of measurement of an enlarged specimen image can be calibrated with a high accuracy. Since different dimensional reference specimen need not be used for a particular magnification, the accuracy of measurement can be readily guaranteed over all magnifications of the charged particle beam equipment.

Other objects, features and advantages of the invention will become apparent from the following description of the embodiments of the invention taken in conjunction with the accompanying drawings.

BRIEF DESCRIPTION OF THE DRAWINGS

FIG. 2 is a diagram illustrating the principles of a mechanism for scanning a charged particle beam;

FIG. 11 is a diagram illustrating an exemplary shift of a visual field in an enlarged specimen image using a deflection coil;

FIG. 12 is a block diagram illustrating a method of correcting a measured dimension in an enlarged image of an actual specimen based on a measured magnification error;

FIG. 14 is a block diagram illustrating a method of calibrating a magnification error by correcting a scanning waveform, with a magnification error fed back to a charged particle beam scanning system, based on a measured magnification error;

FIG. 15 is a flow chart illustrating a method of restraining magnification errors between magnification ranges;

FIG. 16 is a flow chart illustrating a method of correcting a magnification error when an acceleration voltage is changed;

FIG. 18 is a flow chart illustrating a method of correcting a magnification error when a working distance is changed;

DESCRIPTION OF THE EMBODIMENTS

In the following, embodiments of the present invention will be described with reference to the accompanying drawings.

Figure 1:
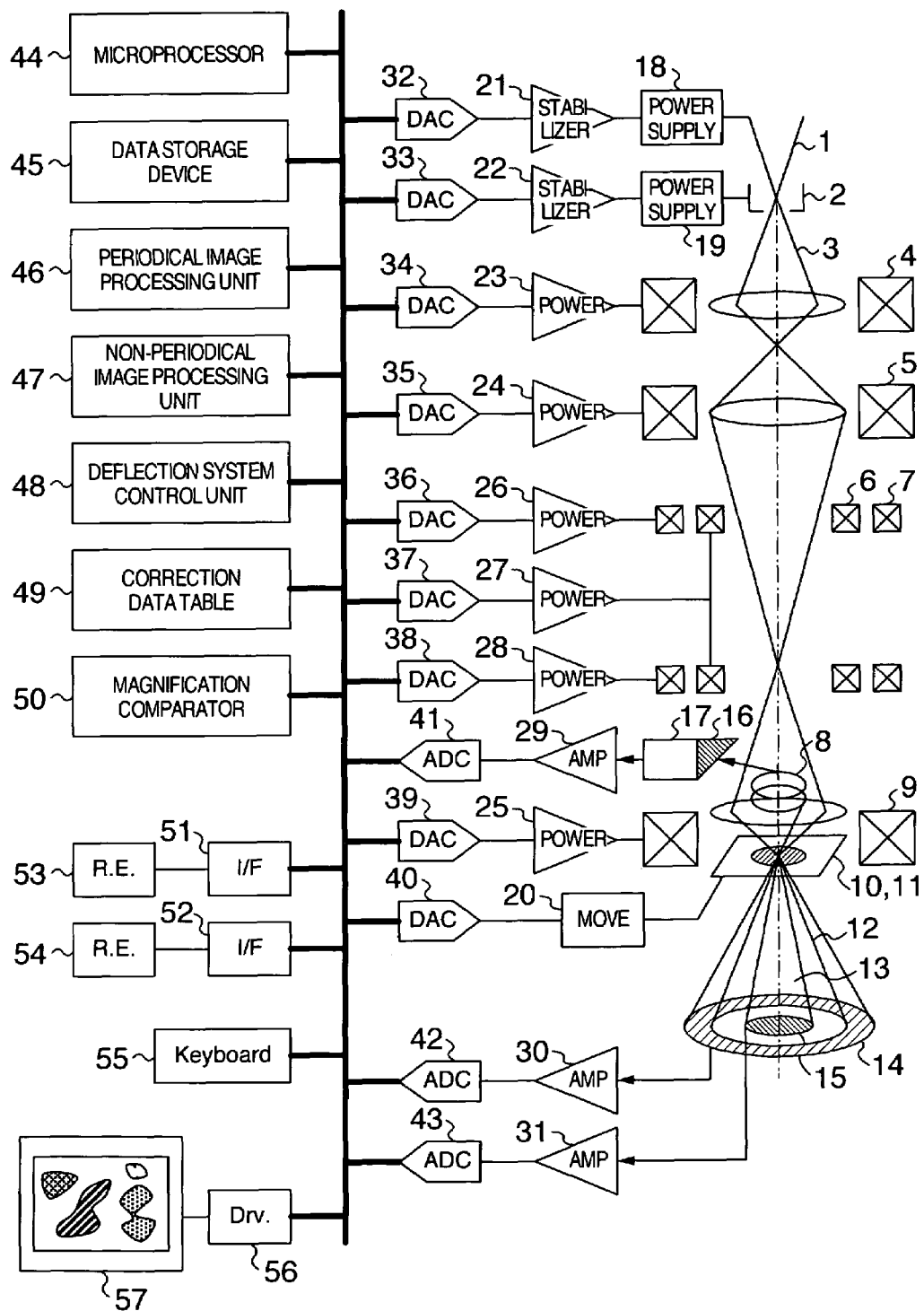
FIG. 1 is a diagram illustrating an exemplary configuration of charged particle beam equipment according to the present invention.
Figure 3A:
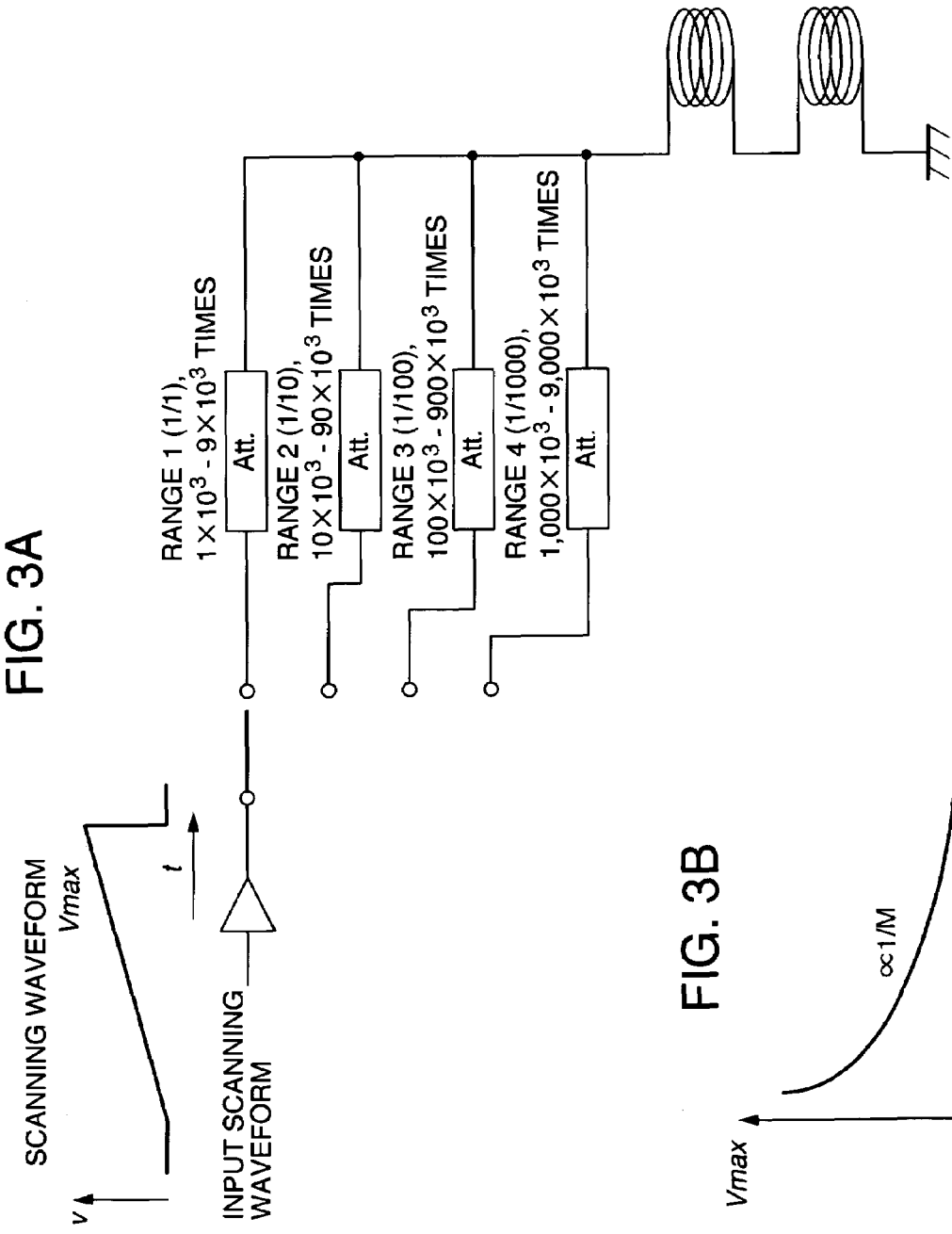
FIG. 3A is a diagram illustrating the principles for changing magnification ranges of the scanning mechanism.
Figure 3B:
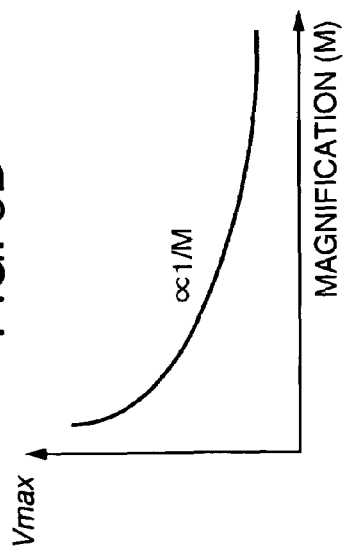
FIG. 3B is a graph showing the relationship between the magnification and a voltage applied to a scanning coil.

FIG. 1 is a functional block diagram generally illustrating an example of charged particle beam equipment according to the present invention. While the present invention can be applied to charged particle beams which may be either a cation beam or an electron beam, the following description will be given in connection with the electron beam. Also, while a focusing electromagnetic lens, an objective electromagnetic lens, a deflector, and a scanner may be of an electric field based electrostatic type or a magnetic field based type, the following description will be given in connection with the magnetic field type. Further, the existence and the number of stages of projection electromagnetic lenses under a specimen are not critical to the present invention.

An electron beam (charged particle beam) 3 emitted from an electron beam source (charged particle beam source) 1 and accelerated by an acceleration electrode 2 is irradiated to a specimen 11 held on a specimen stand 10 through a pre-magnetic field of a first focusing electromagnetic lens 4, a second focusing electromagnetic lens 5, and an objective electromagnetic lens 9. As the specimen 11 is irradiated with the electron beam 3, secondary electrons 8, specimen forward scattering electrons 12, specimen transmitted electrons 13, which have information on the specimen, are generated by an interaction of the specimen 11 with the electron beam 3. The electron beam 3 irradiated to the specimen scans on the specimen by scanning coils 6 arranged symmetric to the optical axis of the electron beam.

By establishing the synchronization of the scanning of the electron beam with the scanning on a screen, an enlarge specimen image is formed on a display device 57. The secondary electrons 8 generated from the specimen cause a scintillator 16 to emit light, and are detected by a photo multiplier tube 17, amplified by a micro-current amplifier 29, and taken into a data bus by an ADC 41. While the scintillator and photo multiplier tube are used for detecting the secondary electrons, a semiconductor detector such as a multi-channel plate may be used instead. The specimen forward scattering electrons 12 are detected by a forward scattered electron detector 14, while the specimen transmitted electrons 13 are detected by a specimen transmitted electron detector 15. Each of the detectors 14 and 15 may comprise a combination of a scintillator with a photo multiplier tube, or a semiconductor detector.

Instructions such as an acceleration voltage, an electron beam lead-out voltage, a filament current and the like from a microprocessor 44 are received by DAC's 32, 33 through the data bus, converted to analog signals, and set into the charged particle beam power supply 18 and an acceleration voltage power supply 19 which in turn drive the electron beam source 1 and acceleration electrode 2, respectively. The microprocessor 44 sets lens current conditions for the first focusing electromagnetic lens 4, second focusing electromagnetic lens 5, and objective electromagnetic lens 9. In response to the set conditions, DAC 34, 35, 39 set excitation power supplies for the respective lenses, so that the electromagnetic lenses are applied with currents.

The position of the specimen 11 is set by an operator who drives the specimen stand 10 using a rotary encoder 54, or by driving the specimen stand 10 in accordance with a specimen position driving pattern which has been previously recorded in a data storage device 45.

Figure 5:
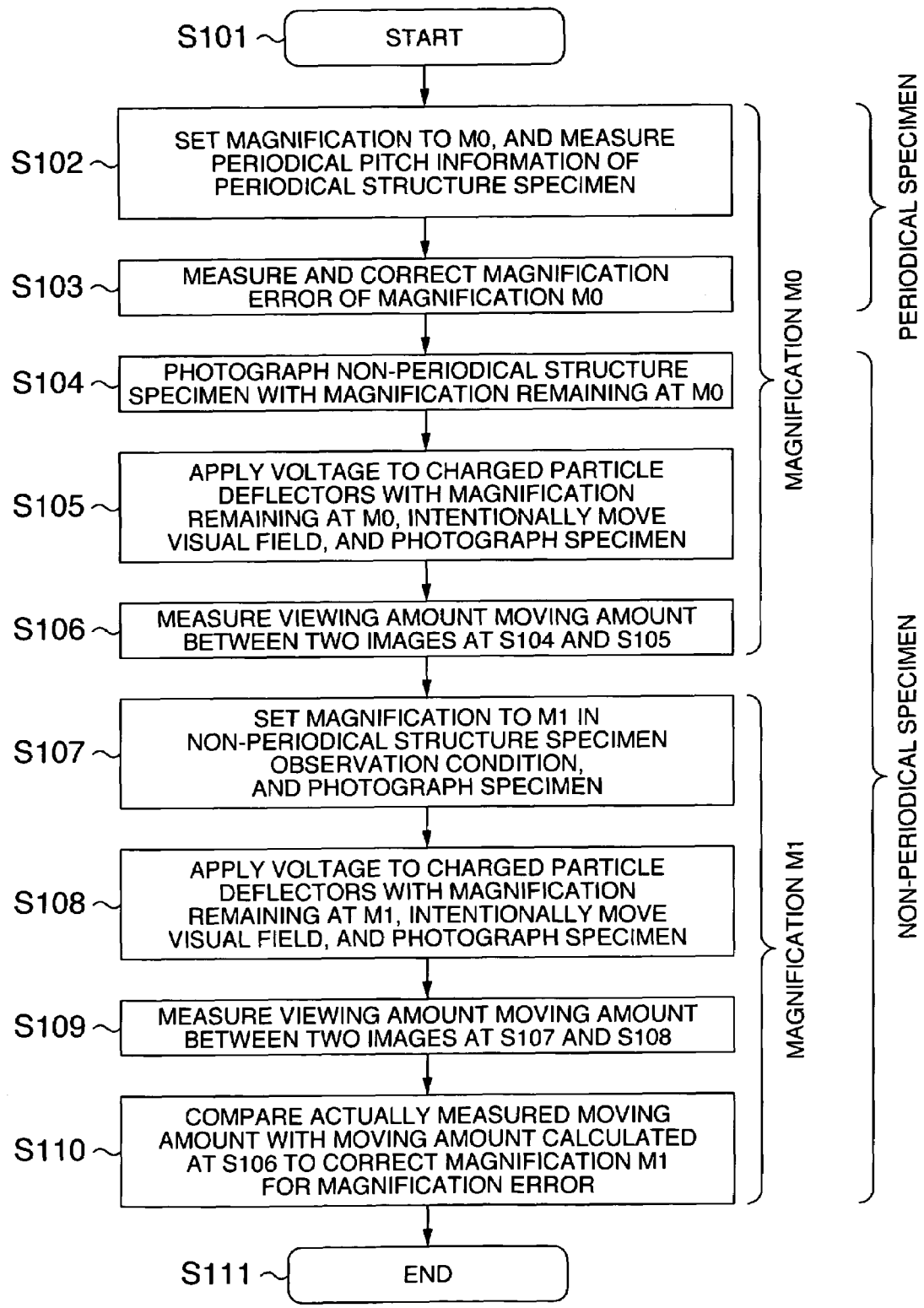
FIG. 5 is a flow chart for describing the operation of charged particle beam equipment which has a function of restraining magnification errors between different magnifications according to the present invention.

Referring to FIG. 5, a description will be given of a method of calibrating a measured dimension error in an enlarged specimen image at each magnification step by the charged particle beam equipment.

The flow of FIG. 5 can be roughly divided into three processes. A first process (from step S102 to step S103) uses a specimen having a periodical structure, the dimensions of which are known at a magnification (M0) which is defined to be a magnification reference; a second process (from step S104 to step S106) for measuring the amount of a shift of an image before and after an electron beam deflector is operated using an arbitrary specimen having a non-periodical structure at the magnification (M0) which is the magnification reference; and a third process (from step 107 to step S110) for measuring the amount of a shift of an image of a non-periodical structure specimen before and after the magnification is changed to a magnification (M1) at which a magnification calibration is performed to operate the electron beam deflector, and measuring a magnification error.

These processes will be described along the flow chart of FIG. 5. At step S102, using a dimension reference specimen having a periodical structure at a known periodical pitch, the magnification is set to M0 at which the periodical pitch can be observed, and periodical pitch information is measured.

First, the dimension reference specimen having the periodical structure is carried on the specimen stand.

Figure 6A:
FIGS. 6A and 6B are diagrams illustrating an exemplary result of a fast Fourier-transform made for a crystalline specimen.
Figure 6B:
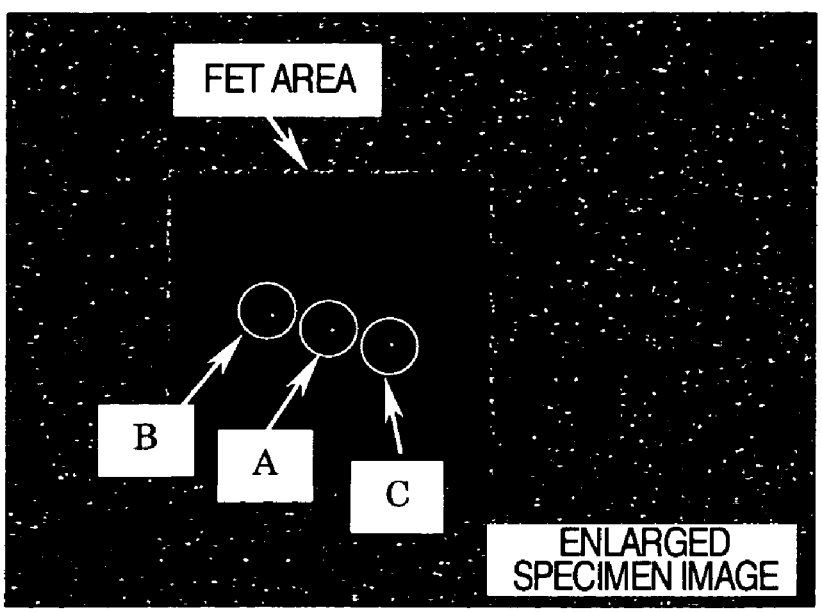

An example of the specimen having a periodical structure may be a specimen as shown in FIGS. 6A-6C. FIG. 6A is an enlarged specimen view of a gold single crystal thin film specimen by scanning transmission electrons, for observing a lattice fringe at intervals of 0.204 nm on a (200) crystalline surface of gold. One feature of this specimen is an extremely small dimension error, because of know dimensions, as compared with errors attributable to the equipment.

Figure 4A:
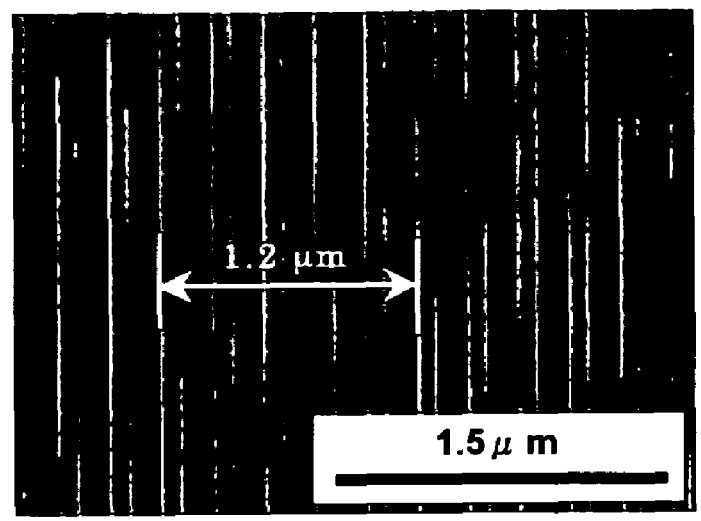
FIGS. 4A and 4B are diagrams showing an example of a specimen for calibrating the dimensions of charged particle beam equipment.
Figure 4B:
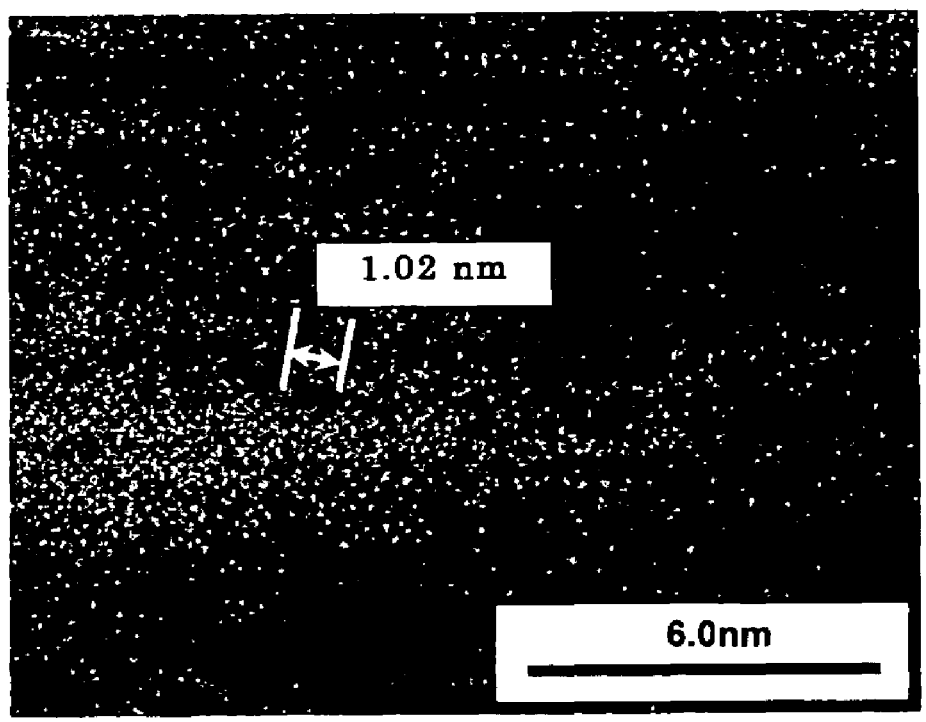

While this embodiment employs the gold single crystal thin film specimen for the dimension reference specimen, a micro scale for magnification calibration, as shown in FIG. 4A, may be used for the specimen as another example. With the use of a specimen having a periodical structure, it is possible to measure average dimensions within an image plane to provide the uniformity on the image plane. The specimen is inserted, and observation conditions are given.

The magnification is set to be optimal for setting the acceleration voltage, setting electron beam irradiation conditions, and observing the reference specimen, and voltages applied to the scanning coils is determined. For example, when the aforementioned gold thin film single crystal specimen is used, the optimal observation magnification ranges from 3,000,000 times to 5,000,000 times. Here, the observation magnification is set to 5,000,000 times.

When, a gold lattice image is used for a periodical specimen of dimensional reference, an enlarged specimen image by specimen transmitted electrons is appropriate, so that a signal from the specimen transmitted electron detector is selected for an image signal, an image of the periodical structure is formed by the microprocessor 44, and the image is recorded in the data storage device 45.

The flow proceeds to step S103, where a magnification error is calculated at the current magnification of M0 to correct the length (unit length) per unit pixel. The length of the unit pixel size is calculated through image processing by the image processing unit 46 from the enlarged image of the periodical structure specimen stored in the data storage device.

FIG. 6B shows an example of calculating and extracting a feature amount of the specimen from the periodical image which has been fast Fourier transformed (FFT) by the processing unit. The contrast and brightness of the periodical image stored in the RAM is adjusted, and FFT processing is performed. The principles of the FFT processing are omitted herein, and a plane interval calculation approach is only referred to.

A square area of the image including $2^n$ pixels is cut out from the enlarged specimen image for the FFT processing. For example, when the enlarged specimen image is recorded in a pixel size of 640×480 pixels, the FFT processing area is defined to be 256×256 pixels or 128×128 pixels and a $2^8$ pixel area or a $2^7$ pixel area.

FIG. 6A shows an image recorded in 1280×960 pixels, while FIG. 6B shows the result of the FFT processing performed for a 512×512 pixel square area. Lattice information appears to be bright points at the maximum intensity at a spatial frequency corresponding to an average period value. In the example of FIG. 6B, three bright points A, B, C appear within the FFT area. Here, the bright point A is a bright point generated at the center of the FFT area, indicative of a DC component of the image, and is a bright point irrespective of the periodical structure. Significant bright points are B and C, so that an average period (pitch) of the periodical structure can be found from spatial frequency coordinates of the bright points B, C. The average pitch $L_p$ (pixels) is calculated by the following equation (1):

$$\text{Average Pitch } Lp(\text{pixels})=I(\text{pixels})/d_{FFT}(FFT \text{ bright point distance}) \quad (1)$$

In the example of FIG. 6B, the distance $d_{FFT}$ between the bright points B and C is 47.07 pixels, so that the average pitch $L_p$ equal to 10.88 (pixels) is calculated from Equation (1). Since the magnification of the enlarged specimen image is 5,000,000 times, and the length of unit pixel at this time, i.e., a pixel size $P_{MOideal}$ is $2\times10^{-11}$ (m/pixel), an actually measured pitch distance $L_d$ is calculated as expressed by Equation (2):

$$\text{Actually Measured Pitch Distance } L_d(\text{nm})=L_p\times P_{MOideal}=10.88\times2\times10^{-11}=0.2118(\text{nm}) \quad (2)$$

By comparing with the plane interval ($L_{std}$) of gold equal to 0.204 nm, a magnification error $\epsilon$ at this magnification can be corrected by Equation (3):

$$\text{Magnification Error } \epsilon=Ld(\text{nm})/Lstd(\text{nm})=0.2118(\text{nm})/0.204(\text{nm})=1.038 \quad (3)$$

As a result of Equation (3), 1.038 is a magnification calibration coefficient at magnification of 5,000,000 times, i.e., a calibration coefficient for the measured dimension value. On the other hand, an actual pixel size $P_{MO}$ at this magnification is found by Equation (4) from the resulting calibration coefficient from Equation (3):

$$\text{Actual Pixel Size } P_{MO}=P_{MOideal}/\epsilon=2\times10^{-11}(\text{nm/pixel})/1.038=1.93\times10^{-11}(\text{pixels}) \quad (4)$$

In this embodiment, FFT is used for calculating the average pitch of the periodical information, but any method may be used as long as it can detect the periodical information, and auto-correlation, for example, may be used instead. The result of calculating the pixel size is stored in the data storage device 45. The display device 57 displays the actual pixel size in an information display area. Generally, since a dimensional reference embedded in image information as a scale bar is more required by the operator than the pixel size, the length of the scale bar is corrected using the result of Equation (4) and displayed on the display device 57. In another example, the measurement result superimposed on the displayed image is corrected to derive a measured dimension value which is displayed on the display device 57.

Figure 7:
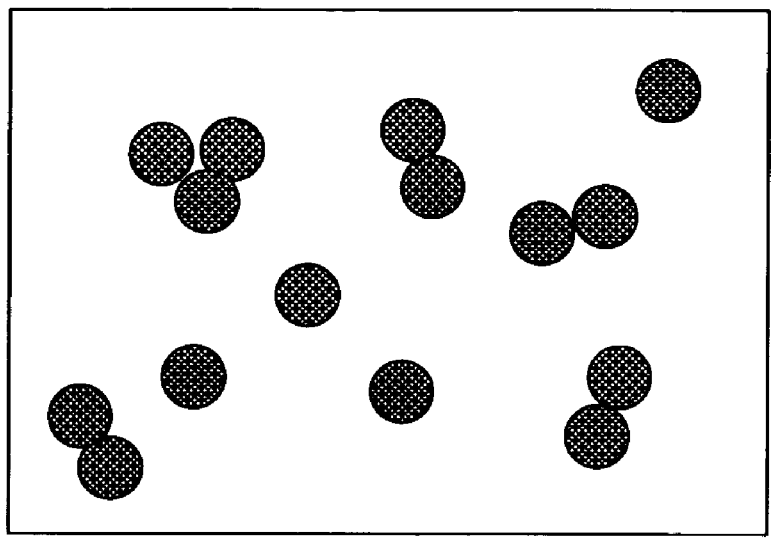
FIG. 7 is a diagram showing an example of a specimen having a non-periodical structure.

At step S104, an arbitrary non-periodical structure specimen having a random structure is carried on the specimen stand, and inserted into the charged particle beam equipment. An example of the non-periodical specimen is one having a structure as illustrated in FIG. 7. A specimen magnification remains the same from step S102 to step S104.

Figure 8:
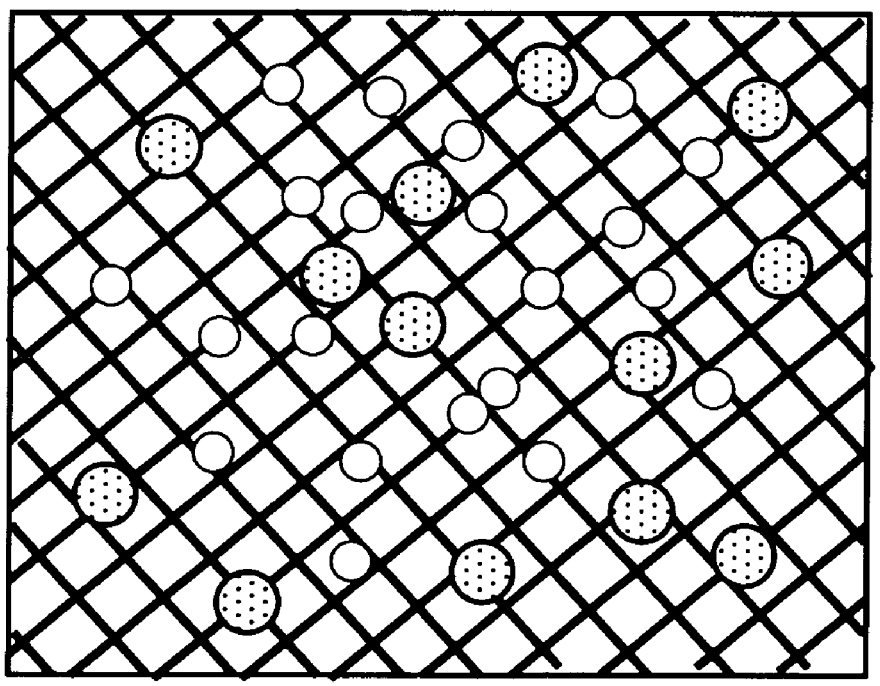
FIG. 8 is a diagram showing an example of a specimen having a periodical structure and a non-periodical structure.

When a used specimen has a feature of a periodical structure overlapping with a non-periodical structure, as illustrated in FIG. 8, as a specimen structure, the specimen need not be replaced at step S104. The specimen is photographed at the same magnification and under the same electro-optical conditions as that photographed at step S102, with reference to the enlarged specimen image having a non-periodical structure as shown in FIG. 7 or FIG. 8, and the image is stored in the data storage device 45.

Figure 9:
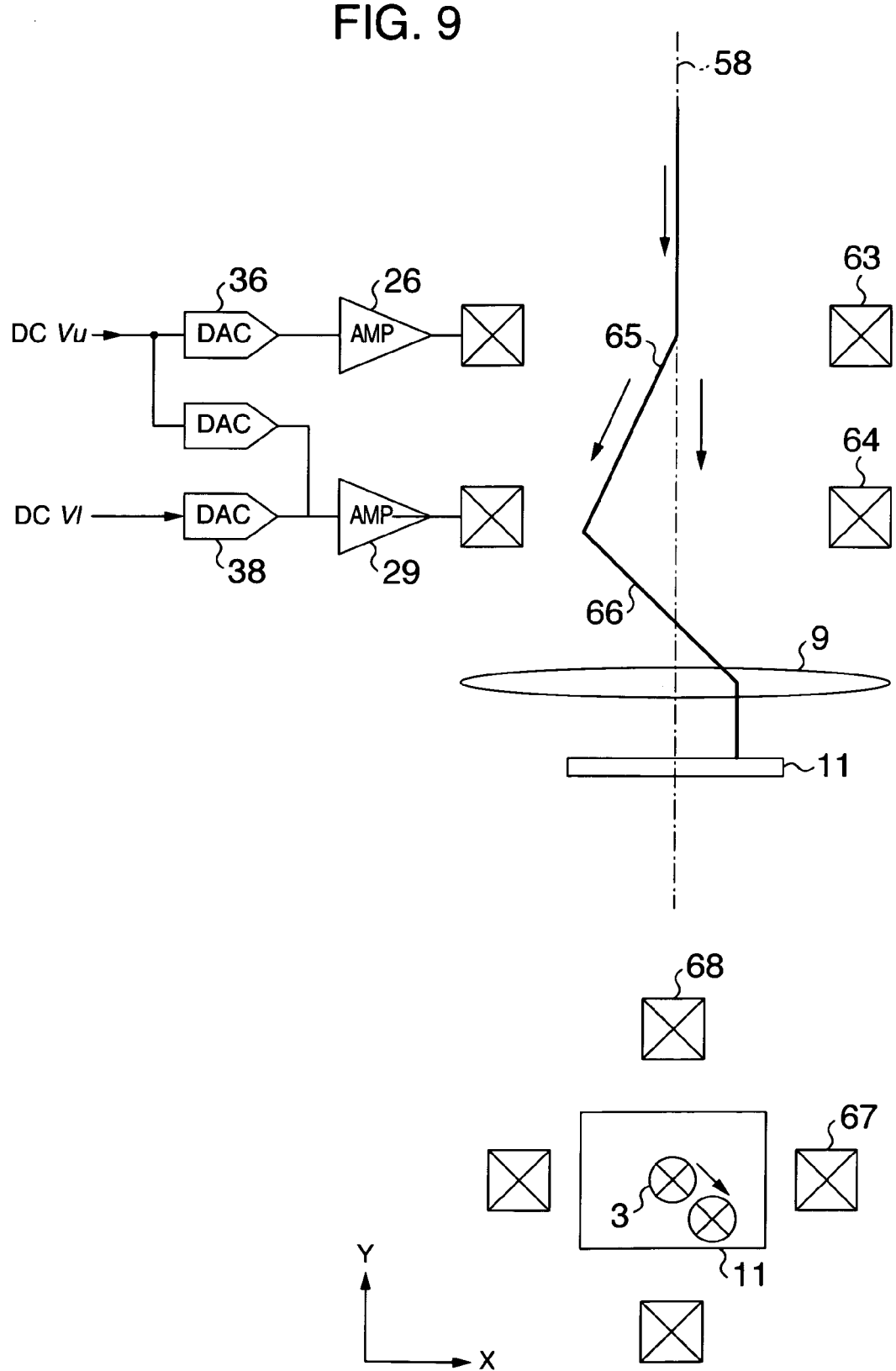
FIG. 9 is a diagram illustrating the principles of a mechanism for deflecting a charged particle beam.

At step S105, a voltage is applied to a charged particle beam deflector with the magnification remaining at M0, and the visual field of the non-periodical structure specimen is intentionally moved. The principles of deflecting an electron beam will be described with reference to FIG. 9. An electron beam 3 is emitted from the electron beam source 1, accelerated by the acceleration electrode 2, and moves along the electron beam optical axis 58.

Deflection coils 67, 68 are arranged symmetrically to the electron beam optical axis 58 in the X- and Y-directions. As an example of positions at which the deflection coils are disposed, they are disposed at the same position as the scanning coils 6 between the second focusing electromagnetic lens 5 and objective electromagnetic lens 9, as in the charged particle beam equipment illustrated in FIG. 1.

The electron beam receives forces from the upper deflection coil 63 and lower deflection coil 64, and is inclined as a deflected electron beam 64. DC voltages are distributively applied to the upper and lower deflection coils through the objective electromagnetic lens such that the electron beam moves away from the optical axis on the specimen. As a result, the electron beam 3 on the optical axis shifts on the specimen 11. As an example, in FIG. 9, the electron beam 3 is deflected in a lower right direction by the voltages applied to the X-deflection coil 67 and Y-deflection coil 68. The electron beam is scanned simultaneously with the deflection, and the visual field also moves from the center of the specimen in the lower right direction. By thus applying the voltages to the deflection coils, the visual field can be moved.

Figure 10A:
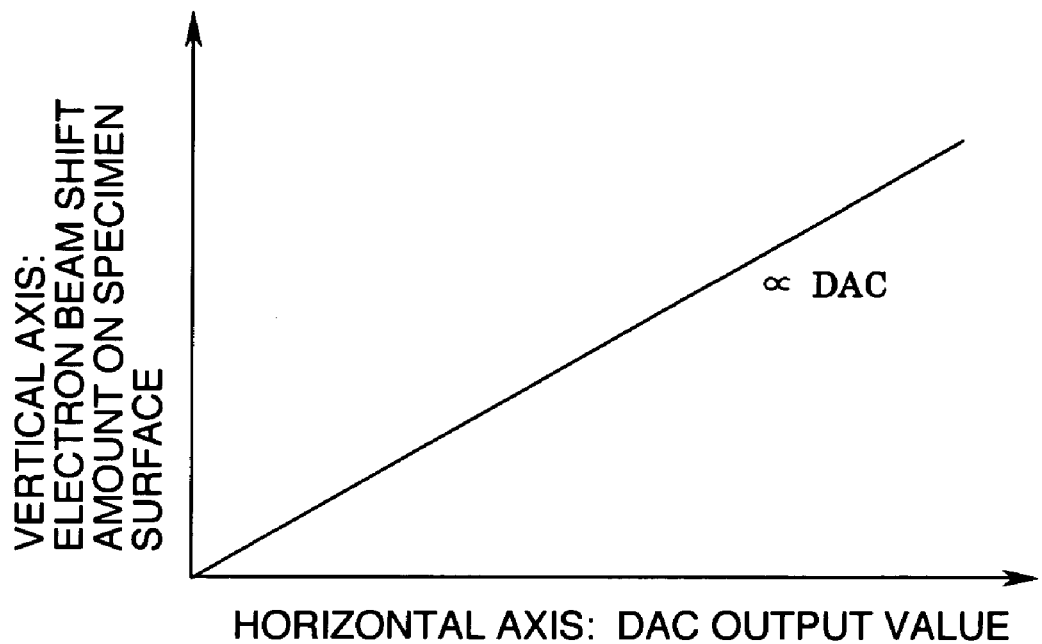
FIGS. 10A and 10B are graphs showing the relationships between a DAC output and the amount of shift of an electron beam on a specimen surface and between a deflection coil current and the amount of shift, respectively.
Figure 10B:
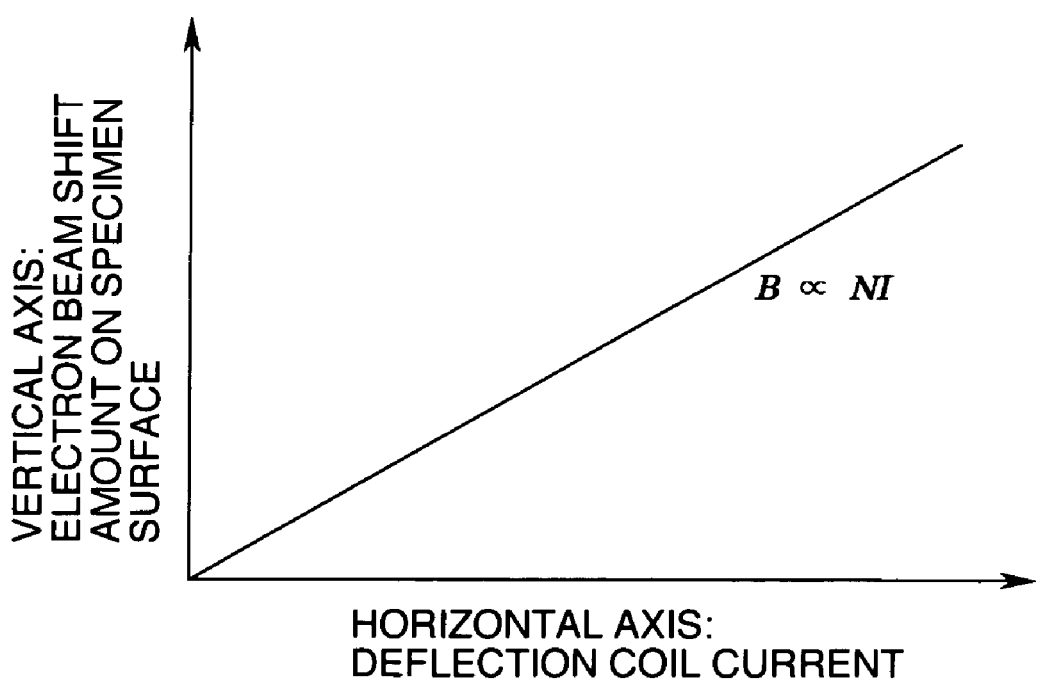

When the electron beam deflection coil is used, a DAC output value of the deflection coil is proportional to an electron beam shift amount on the specimen surface, as shown in FIG. 10A. Also, when a coreless coil having a magnetic permeability of one is used for the deflection coil, the intensity B of the magnetic field is the product of the number N of turns and a current I, and is represented in a linear relationship as expressed by Equation (5):

$$B(T)=\mu_0 NI(A) \quad (5)$$

where $\mu_0$ is the magnetic permeability in vacuum. Therefore, the electron beam shift amount on the surface of the specimen is also proportional to the deflection coil current. Since the electron beam deflection coils operate independently of the scanning coils, the amount by which the electron beam shifts on the specimen is not affected by even a change, if any, in the scanning waveform voltages applied to the scanning coils and in a magnification range.

At step S105, the amount by which the electron beam is shifted using the deflectors may be arbitrary. FIG. 11 is a schematic diagram showing an example in which the visual field is shifted using the deflection coils. The visual field is shifted from a position 70 before a movement of the visual field to a position 71 after the movement by a visual field moving amount d(nm) in an X-direction in FIG. 11. Assume herein that the visual field moving amount d is 10 nm by way of example. In this way, an enlarged image of the non-periodical structure specimen after the visual field has been shifted using the deflectors is recorded in the data storage device as an evaluation image.

At step S106, an image moving amount is calculated between the reference image recorded at step S104 and the evaluation image recorded at step S105. As an example of means for calculating the image shift amount between the reference image and evaluation image, the principles of measuring a visual field moving amount on an image using a phase limit correlation method are described in this embodiment, but a cross-correlation method may be used instead. Since the phase limit correlation method normalizes amplitude information of the image for calculation, this is a useful approach for calculating an image shift amount when an employed focusing method tends to provide a flat contrast for an image such as a scanning transmitted electron image.

The reference image, labeled $f1(m,n)$, is recorded in RAM with the number of pixels M×N. The evaluation image, labeled $f2(m+r',n)$, is recorded in RAM with the number of pixels M×N on the assumption that the visual field has shifted by r' in an m-direction with respect to the reference image. Assume that the respective images are natural images. Here, m=0, 1, 2, ..., M−1, and n=0, 1, 2, ..., N−1. Discrete Fourier images $F1(u,v)$, $F2(u,v)$ of enlarged specimen images $f1(m,n)$, $f2(m,n)$ are defined by Equations (6), (7), respectively.

$$F1(u,v) = \sum_{m=0}^{M-1}\sum_{n=0}^{N-1} f1(m,n)e^{-j2\pi(mu/M+nv/N)} \quad (6)$$
$$= A(u,v)e^{j\alpha(u,v)}$$

$$F2(u,v) = \sum_{m=0}^{M-1}\sum_{n=0}^{N-1} f2(m+r',n)e^{-j2\pi(mu/M+nv/N)} \quad (7)$$
$$= B(u,v)e^{j(\beta+2\pi r'u/M)}$$

where, u=0, 1, 2, ..., M−1, and v=0, 1, 2, ..., N−1, A(u,v) and B(u,v) are amplitude spectra, and α, β are phase spectra.

By setting the amplitude spectra A(u,v), B(u,v) to constants, the resulting phase limited image can be independent of the contrast and brightness of the images. From Equations (6), (7), the phase images $F1'(u,v)$ and $F2'(u,v)$ are expressed in the following equations, respectively:

$$F1'(u,v)=e^{j\alpha(u,v)} \quad (8)$$

$$F2'(u,v)=e^{j(\beta+2\pi r'u/M)} \quad (9)$$

The phase image $F1'(u,v)$ is multiplied by a complex conjugate of $F2'(u,v)$ to find a combined phase image $H12(u,v)$ expressed by Equation (10):

$$H12(u,v) = F1'(u,v)(F2'(u,v))^* \quad (10)$$
$$= e^{j(\alpha-\beta-2\pi r'u/M)}$$

The correlation intensity image, i.e, reference image and the evaluation image present a matching degree $g12(r,s)$ as expressed by Equation (11):

$$g12(r,s) = \sum_{u=0}^{M-1}\sum_{v=0}^{N-1} (H12(u,v))e^{j2\pi(ur/N+vs/N)} \quad (11)$$
$$= \sum_{u=0}^{M-1}\sum_{v=0}^{N-1} \left(e^{j(\alpha-\beta-2\pi r'u/M)}\right)e^{j2\pi(ur/N+vs/N)}$$
$$= g12(r-r')$$

From Equation (11), a shift amount r' exists between the enlarged specimen images of the reference image and evaluation image, so that a correlation peak position of the correlation intensity image shifts by −r', and the shift amount is calculated from this result.

First, unit of DAC output value V is (LSB) and it expresses a digital value utilizing minimum bit value as a reference.

$$d_m(\text{nm})=d(\text{pixels})\times P_{MO}(\text{nm/pixel}) \quad (12)$$

The relationship between the shift amount and the DVC value V outputted to the deflection coil is calculated by the following equation (13) as a unit shift amount $D_{MO}$:

$$D_{MO}(\text{nm/LSB})=d_m(\text{nm})/V(\text{LSB}) \quad (13)$$

Here, field of view shift amount d expressed by pixel number is dimension converted into unit of distance dm(nm) in accordance with equation (12).

When the visual field is shifted by 10 nm with the output value from the DAC assuming to be 10 LSB's, the distance $d_m$ is calculated to be 1 (nm/LSB) from Equation (12).

The magnification is changed to a desired magnification step at which the accuracy of measurement is calibrated at step S107, the non-periodical structure specimen photographed at step S104 is again photographed at the larger magnification and stored in the data storage device as a reference image at magnification M1. In this event, no voltage is applied to the deflectors. Since it is only required to detect the relationship between the voltage applied to the electron beam deflection coil and a visual field moving amount, a specimen of non-periodical structure different from the non-periodical structure specimen inserted at step S1016 may be inserted.

Next, at step S108, the deflection coils are applied with voltages with the magnification unchanged from M1. As a result, an image can be generated with a visual field moved from the image stored at S107, so that this image is stored in the data storage device as an evaluation image at the magnification M1.

Since the visual field moving amount has been previously found for a unit DAC value at step S106, the visual field moving amount can be found if an arbitrary DAC output value is given at step S108. The visual field moving amount may be changed in accordance with the magnification at which a calibration is performed. Specifically, the visual field moving amount may be changed to 10 nm as given at step S106 or even to 100 nm in a range in which the linearity is maintained for the deflection coils, as long as the shift amount is not increased to such an extend that it cannot be detected by image processing, or the shift amount is not too large to depart from the image.

At step S109, a visual field moving amount is measured between the two images stored at steps S107 and S108, respectively. The measurement of the visual field moving amount between the reference image and the evaluation image at the magnification M1 may be made in accordance with the phase limit correlation method described at step S106 or in accordance with the cross-correlation method.

At step S110, the actually measured moving amount is compared with the actually measured moving amount calculated at step S106 to calculate a magnification error at the magnification step M1 for correction. $d_{M1}$ which is derived as a visual field shift amount $d_{M1}$ (pixel) at the magnification M1 is converted in dimension into distance units by Equation (14):

$$d_{mM1}(\text{nm})=d_{M1}(\text{pixels})\times P_{MO}(\text{nm/pixel})\times(M1/M0) \quad (14)$$

Equation (14) provides an image shift amount found from the reference magnification M0, and an image shift amount $d_{mM1real}$ at the magnification M1 is given by Equation (15):

$$d_{mM1real}(\text{nm})=d_{M1}(\text{pixels})\times P_{M1ideal}(\text{nm/pixel}) \quad (15)$$

Therefore, an error of the actual shift amount with respect to the shift amount calculated at the reference magnification is found by Equation (16):

$$\epsilon_{err}=d_{mM1real}(\text{nm})/d_{mM1}(\text{nm}) \quad (16)$$

When a shift amount of 10 nm given at the magnification M1 results in an evaluation of 10.5 nm, the shift amount implies 1.05 times of error. The magnification calibration may be directed to a measured length for a displayed image, or DAC values outputted to the scanning coils. An exemplary calibration will be described with reference to FIGS. 12 to 14.

FIG. 12 is a block diagram illustrating an exemplary method of correcting a displayed image for a measured length. Blocks D101 to D102 in FIG. 12 correspond to steps S101 to S109. The magnification difference $\epsilon_{err}$ is calculated by Equation (16), and held in the data storage device.

An image to be actually evaluated is photographed at the magnification M1 at D104, and a desired distance is measured within the photographed image at D105. This result of the measurement is labeled L which is a value including a magnification error. The magnification M1 is a magnification for which a magnification error has been calculated. The magnification error is corrected in accordance with Equation (17):

$$\text{Calibrated Value } L_{cal}(\text{nm}) = \text{Measured Value } L(\text{nm})/\epsilon_{err} \qquad (17)$$

and outputted as shown in D107. The outputted data is displayed on the display device included in the charged particle beam equipment.

Figure 13:
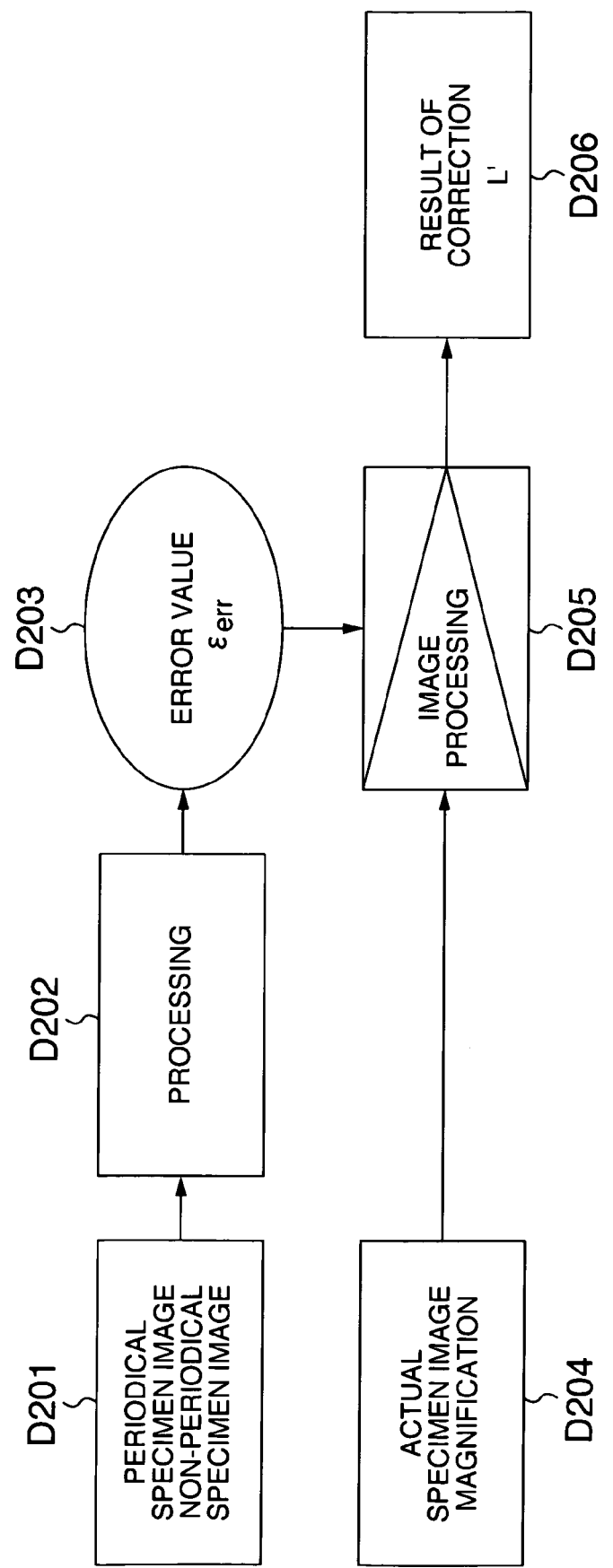
FIG. 13 is a block diagram illustrating a method of correcting an enlarged image of an actual specimen for magnification by image processing based on a measured magnification error.

FIG. 13 is a block diagram illustrating an exemplary method of changing the scale of a photographed image to correct the magnification. Blocks D201-D203 represent a process for calculating the magnification error $\epsilon_{err}$ in accordance with Equation (16). At D204, an image is photographed at the magnification M1 for which a magnification error has been calculated, and the image is scaled up or down based on the magnification error value given at D203 through image processing.

At D205, the image is photographed in a digital form, but an even an analog image must be stored as digital data. At D206, the processed image is displayed on the display device as an image corrected for the magnification, and is stored in the data storage device.

FIG. 14 is a block diagram illustrating a method of feeding a calculated magnification error back to a scanning coil current value for correction. At D303, a magnification error is calculated. The charged particle beam equipment comprises a scanning coil for scanning an electron beam to capture an enlarged image of a specimen, a processing unit for providing a current applied to the scanning coil, and a DAC. A DAC output value for controlling the current value applied to the scanning coil is applied with control represented by Equation (18) to control the waveform of the scanning coil current and calibrate the magnification.

$$\text{Calibrated Value } V_{cal} = \text{Scanning Coil DAC Value } V_{scan}/\epsilon_{err} \qquad (18)$$

In this embodiment, the visual field is shifted by a method using deflection coils, but the visual field can be similarly shifted using a specimen stand.

Figure 17:
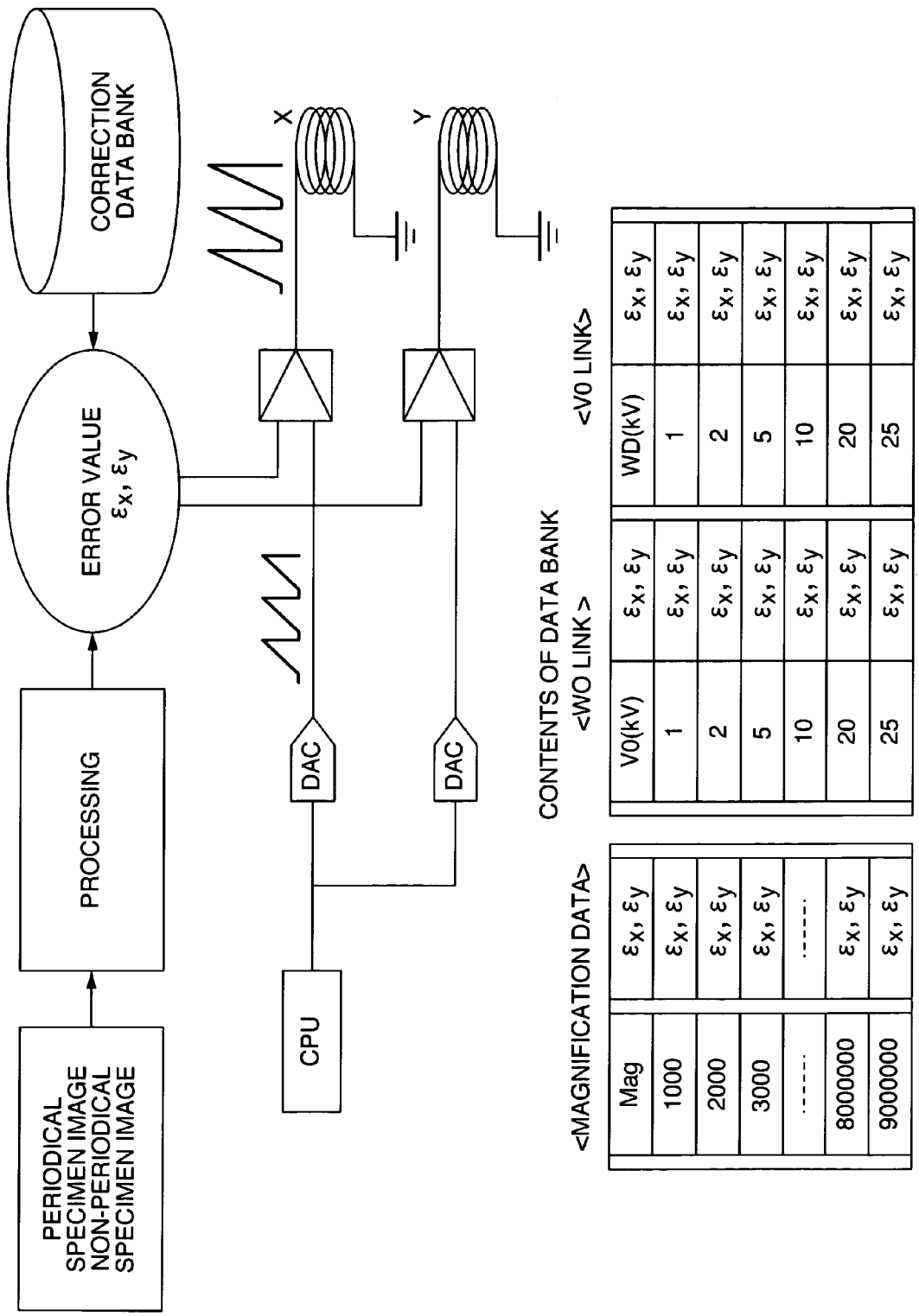
FIG. 17 is a diagram for describing a correction data bank for holding magnification errors which have been measured under a variety of conditions.

Also, another specimen has been previously set on the specimen stand in addition to a specimen under observation in order to evaluate errors in measured dimensions, and the magnification setting is automatically switched by the microprocessor 44 to automatically photograph the image, and evaluate a moving amount, thereby making it possible to calibrate the dimensions with a high accuracy over all magnifications without manual intervention. This charged particle beam equipment comprises a correction data table, and a magnification data bank as shown in FIG. 17, and contains all information on magnification steps, at which magnification errors have been measured, as data.

FIG. 15 is a flow chart for describing a method of correcting a magnification error between magnification ranges. After the processing at steps S101 to S106 shown in FIG. 5, processing at S201 shown in FIG. 15 is performed. At S201, the magnification is switched to a different magnification range MB1, and a specimen having a non-periodical structure is photographed at MB1 at S202.

At S203, the charged particle beam deflector is applied with a voltage with the magnification remaining at MB1, and the visual field of the non-periodical structure specimen is intentionally moved. While the charged particle beam deflector may be either an electrostatic deflector or an electromagnetic deflector, this embodiment will be described in connection with the electromagnetic deflector, i.e., electron beam deflection coil. The visual field is intentionally moved by applying a voltage to the electron beam deflection coil. The amount of the applied voltage is set equal to the amount applied at S105.

At S204, the amount of movement is measured between the image photographed at S202 and the image photographed at S203 with a shifted visual field. The amount of movement of the visual field may be measured in accordance with the phase limit correlation method or the cross-correlation method. At step S205, the actually measured amount of movement is compared with the calculated amount of movement calculated at S106 to calculate a magnification error at the magnification MB1 for correction. The magnification error is calibrated using the approach shown in FIGS. 12 to 14 described above.

Next, a description will be given of a magnification error correction when the acceleration voltage is changed or when a working distance of a specimen is changed.

FIG. 16 is a flow for correcting a magnification at which images are photographed with different acceleration voltages in the charged particle beam equipment which is capable of changing the acceleration voltage. At step S302, the acceleration voltage is changed to VB, and a magnification error is measured at the acceleration voltage VB at step S303. At step 303, the magnification error is measured by the same method as that used at steps S102 to S110 shown in FIG. 5.

At step S304, magnification error data is registered in a correction data bank which is provided for each acceleration voltage. FIG. 17 illustrates an example of the configuration and contents of the correction data bank. The calculated magnification error is registered in the correction data bank.

At step S305, registered data is retrieved for use with the acceleration voltage to correct the magnification error. In FIG. 17, the magnification is calibrated by correcting a voltage applied to the scanning coil, but alternatively, the magnification may be calibrated by a method which corrects the aforementioned measured length, or a method which scales up or down the photographed image through image processing to calibrate the magnification. Also, the error value is represented by an x-component and a y-component which are designated by $\epsilon_x$, $\epsilon_y$, respectively, in consideration of possible dependence of the magnification error on the scanning direction, but the number of dimensions is not a matter.

FIG. 18 is a flow chart illustrating a method of correcting a magnification error at different working positions in the charge particle beam equipment. The working distance is changed to WD2 at step S402, and a magnification error is measured at the working distance WD2 at step 403.

At step 403, the magnification error is measured in a similar procedure to steps S102 to S110 shown in FIG. 5. At step S404, magnification error data is registered in a correction data bank which is provided for each working distance. FIG. 17 shows an example of the configuration and contents of the correction data bank. The calculated magnification error is registered in the correction data bank. At step S405, registered data is retrieved for use at the working distance to correct the magnification error.

Figure 19A:
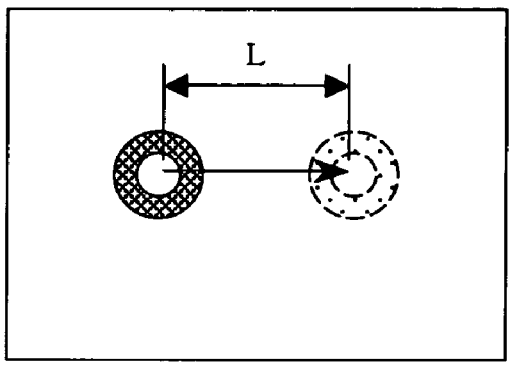
FIGS. 19A and 19B are diagrams for describing images before (A) and after (B) an image rotation angle θ is applied, and a movement of aa visual field.
Figure 19B:
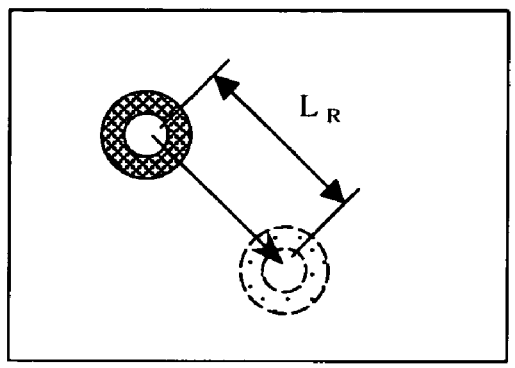

FIGS. 19A and 19B are conceptual diagrams illustrating a method of correcting a magnification error which may be produced when an image is rotated using an image rotation circuit of the charged particle beam equipment. A description will be given of a method of correcting a magnification error which is produced when an image is rotated at or within the same magnification, using the approaches for correcting magnification errors between different magnification steps and between different magnification ranges, as illustrated in FIGS. 5 and 16.

When an image is rotated through the image rotation circuit, different magnification errors occur due to inherent errors of circuit components even at the same magnification. When an electron beam is deflected using the deflector illustrated in FIG. 9 with an image rotation angle set at 0° as shown in FIG. 19A, assume that the image moves by a moving amount L. Next, when the image rotation angle is set to θ, this moving amount $L_R$ has a different value even though the deflection amount is the same.

Figure 20:
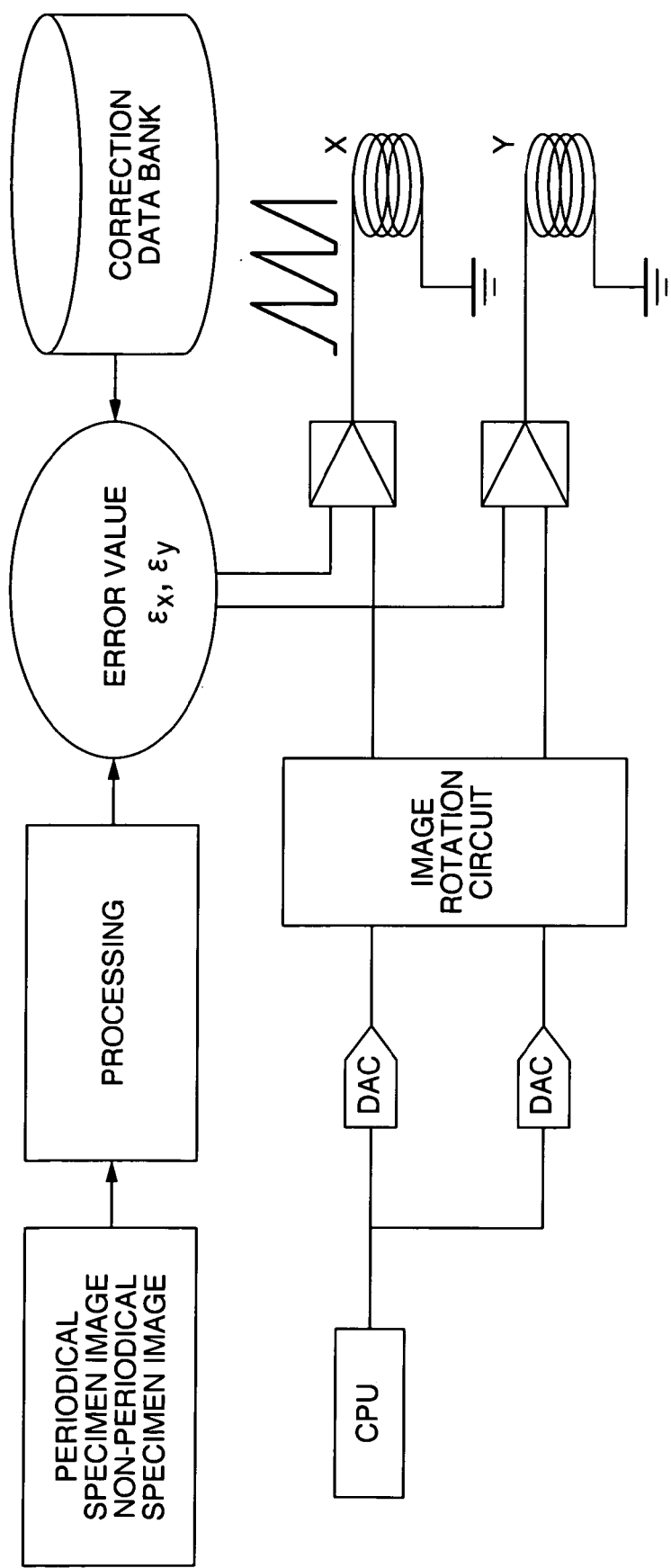
FIG. 20 is a block diagram for describing a mechanism for calibrating a magnification error through image rotation, comprising a charged particle beam scanning circuit, a magnification error measuring mechanism, and a correction data bank.

FIG. 20 illustrates the configuration of a charged particle beam scanning circuit including an image rotation circuit, and a correction data bank. The image rotation circuit is designed to control currents applied to scanning coils.

Figure 21:
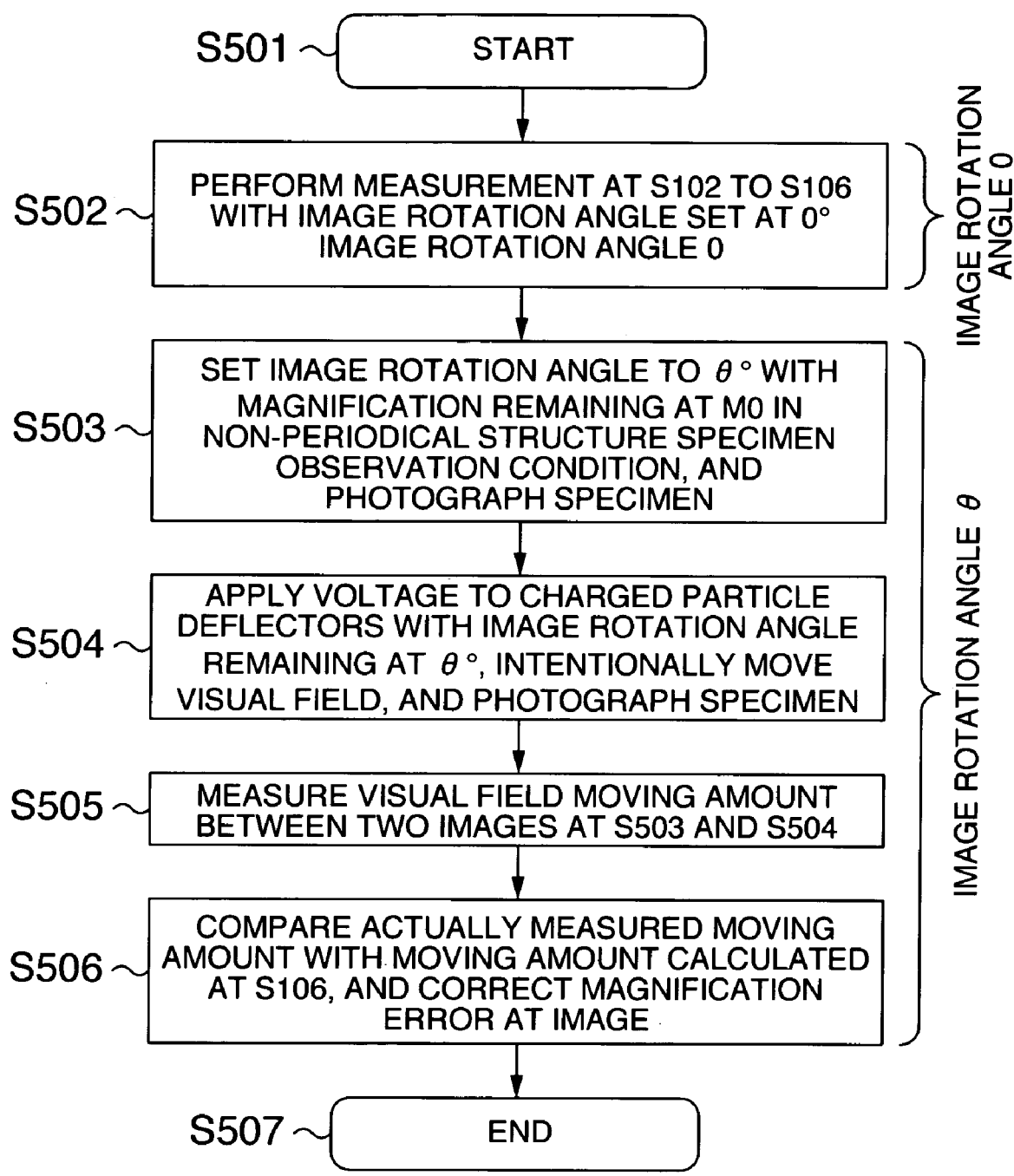
FIG. 21 is a flow chart illustrating a method of correcting a magnification error caused by image rotation.

FIG. 21 is a flow chart for the charged particle beam equipment to measure and correct a magnification error caused by image rotation. Assume that a magnification error due to image rotation is corrected at a magnification M0, and the image is rotated over an angle θ.

At step S502, a measurement, at S102 to S106 shown in FIG. 5, is made with the image rotation angle remaining at 0°. At the image rotation angle of 0°, the image passes through the image rotation circuit without being affected thereby.

At step S503, the image rotation angle is set to θ with the magnification remaining at M0, and a non-periodical structure specimen is observed. At step 504, the charged particle beam deflector is applied with a voltage equal to the voltage applied at step S105, with the image rotation angle remaining at θ, and the specimen is photographed with the visual field being intentionally moved.

At step S505, the amount of visual field movement is measured between the two images at steps S503 and S504. The measurement may be made in accordance with either the phase limit correlation method or the cross-correlation method. At step S506, the actually measured amount of movement at S505 is compared with the calculated amount of movement calculated from S106 to calculate a magnification error at the magnification M0 and image rotation angle θ and correct the magnification error.

Figure 22A:
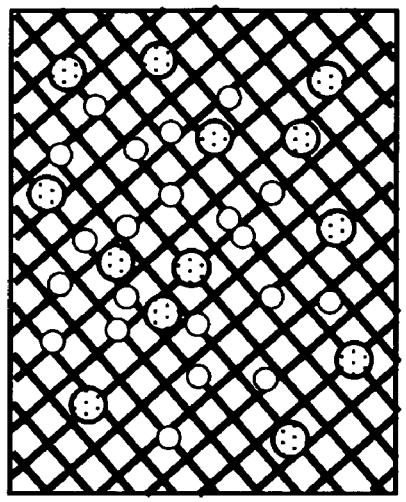
FIGS. 22A and 22B are diagrams illustrating an enlarged image of a specimen having a non-periodical structure and a periodical structure, and enlarged images of the specimen generated from signals detected by different detectors and displayed on a display device.
Figure 22B:
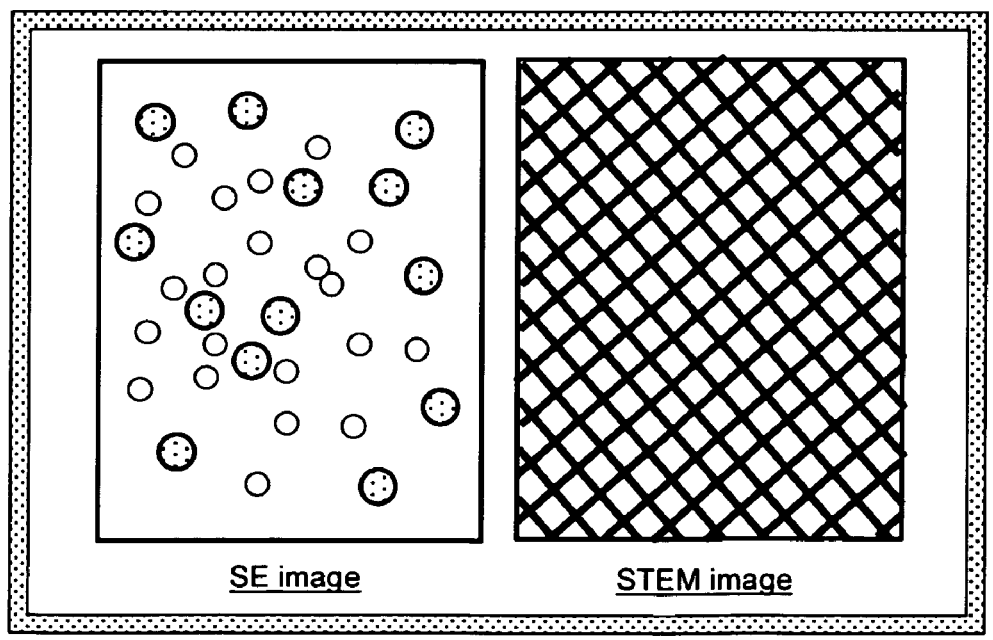

FIG. 22 is a diagram for describing an exemplary application of the charge particle beam equipment. FIG. 22A is a conceptual diagram illustrating a specimen which has a periodical structure and a non-periodical structure. As illustrated in FIG. 1, the charged particle beam equipment comprises a secondary electron detector, a transmitted electron detector, and a scattered electron detector. FIG. 22B illustrates an enlarged view of the specimen displayed on a display device of the equipment. Since the charged particle beam equipment comprises the three detectors, an image by the secondary electron detector and an image by the transmitted electron detector, for example, can be simultaneously detected for simultaneous display.

For a specimen having a periodical structure and a non-periodical structure as illustrated in FIG. 22A, the non-periodical structure is detected in a secondary electron image, and simultaneously with this, the periodical structure alone is detected by transmitted electrons. In this way, steps S102 to S105 in FIG. 5 can be performed in parallel to reduce the execution time. When a crystal lattice fringe is employed for the periodical structure, either a transmitted electron image or a scattered electron image must be relied on to observe the crystal lattice image, whereas minute particles and dusts, which make up the non-periodical structure existing on the specimen, can be readily observed in a secondary electron image which provides high contrast.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. Charged particle beam equipment comprising:
a charged particle beam source for generating a charged particle beam;
a specimen stand for holding a specimen;
a lens system for focusing the charged particle beam onto the specimen;
a scanner for scanning the charged particle beam on the specimen;
a deflector for deflecting the charged particle beam;
a detector for detecting a specimen signal generated from the specimen by irradiation of the charged particle beam thereto;
an image processing unit for processing an image; and
a display unit for displaying a specimen image,
wherein a ratio of a control amount of said deflector to a visual field moving amount is calculated at the same accuracy as an accuracy of measurement of the specimen having a known periodical structure, using a magnification error of a first magnification derived by extracting a periodical dimension by said image processing unit from an enlarged image of the specimen having the known periodical structure recorded at the first magnification, and the visual field moving amount, and the visual field moving amount measured by said image processing unit from a reference image and an evaluation image, said reference image being an enlarged image of the specimen having a non-periodical structure recorded at the first magnification, and said evaluation image being an enlarged image of the specimen having a non-periodical structure recorded at the first magnification with a visual field being moved by controlling said deflector.

2. Charged particle beam equipment comprising:
a charged particle beam source for generating a charged particle beam;
a specimen stand for holding a specimen;
a lens system for focusing the charged particle beam onto the specimen;
a scanner for scanning the charged particle beam on the specimen;
a deflector for deflecting the charged particle beam;

a detector for detecting a specimen signal generated from the specimen by irradiation of the charged particle beam thereto;

an image processing unit for processing an image; and a display unit for displaying a specimen image, wherein a magnification error of a first magnification is derived by extracting a periodical dimension from an enlarged image of the specimen having a known periodical structure recorded at the first magnification by said image processing unit, an enlarged image of the specimen having a non-periodical structure is recorded at the first magnification corrected for the magnification error as a reference image, the enlarged view of the specimen having the non-periodical structure is recorded as an evaluation image after a visual field has been moved by controlling said deflector, a ratio of a control amount of said deflector to a visual field moving amount is found from a visual field moving amount of the evaluation image with respect to the reference image measured by said image processing unit, the magnification is set to a second magnification different from the first magnification, a visual field moving amount of an enlarged view of the non-periodical structure specimen is found before and after the visual field is moved by controlling said deflector, the second magnification is calibrated from a ratio of the visual field moving amount at the second magnification to the visual field moving amount at the first magnification corrected for the magnification error.

3. Charged particle beam equipment according to claim 2, wherein said specimen having a known periodical structure is a single crystal thin film specimen having a known crystal structure, and said detector is a transmitted electron detector.

4. Charged particle beam equipment according to claim 2, wherein said specimen having a known periodical structure is a single crystal thin film specimen having a known crystal structure, and said detector is a scattered electron detector.

5. Charged particle beam equipment according to claim 2, wherein said specimen includes a mixture of a non-periodical structure and a known periodical structure.

6. Charged particle beam equipment according to claim 5, wherein enlarged specimen images are simultaneously photographed from two different types of charged particle beams generated from the specimen including a mixture of the non-periodical structure and the known periodical structure to simultaneously acquire and process feature amounts of the periodical structure and the non-periodical structure.

7. Charged particle beam equipment according to claim 2, wherein the magnification is calibrated by correcting a measured value evaluated with an enlarged specimen image.

8. Charged particle beam equipment according to claim 2, wherein the photographed enlarged specimen image is scaled up or down to output an image which has been calibrated for the magnification.

9. Charged particle beam equipment according to claim 2, wherein a voltage waveform applied to said scanner is corrected to calibrate the magnification.

10. Charged particle beam equipment according to claim 2, further comprising a correction data table which records a magnification correction value for each magnification step.

11. Charged particle beam equipment according to claim 10, wherein said magnification correction data table records a magnification correction value when an acceleration voltage is changed for a charged particle beam.

12. Charged particle beam equipment according to claim 10, wherein said magnification correction data table records a magnification correction value when a working distance is changed.

13. Charged particle beam equipment comprising:

a charged particle beam source for generating a charged particle beam;

a specimen stand for holding a specimen;

a lens system for focusing the charged particle beam onto the specimen;

a scanner for scanning the charged particle beam on the specimen;

a deflector for deflecting the charged particle beam;

a detector for detecting a specimen signal generated from the specimen by irradiation of the charged particle beam thereto;

an image processing unit for processing an image;

a display unit for displaying a specimen image; and a specimen image rotation unit for rotating a specimen image, wherein a magnification error of a first magnification is derived by extracting a periodical dimension from an enlarged image of the specimen having a known periodical structure recorded at the first magnification by said image processing unit, an enlarged image of a specimen having a non-periodical structure is recorded at the first magnification corrected for the magnification error as a reference image, the enlarged view of the specimen having the non-periodical structure is recorded as an evaluation image after a visual field has been moved by controlling said deflector, a ratio of a control amount of said deflector to a visual field moving amount is found from a visual field moving amount of the evaluation image with respect to the reference image measured by said image processing unit, the specimen image is rotated by said specimen image rotation unit to display a rotated specimen image, a visual field moving amount of an enlarged view of the non-periodical structure specimen is found before and after the visual field is moved by controlling said deflector, and the magnification is calibrated for the specimen image rotated by said specimen image rotation unit from a ratio of a visual field moving amount when the specimen image is rotated to a visual field moving amount of the enlarged specimen image not rotated.

* * * * *